US010096352B2

(12) United States Patent
Khan et al.

(10) Patent No.: US 10,096,352 B2
(45) Date of Patent: Oct. 9, 2018

(54) FERROELECTRIC CAPACITOR WITH IMPROVED FATIGUE AND BREAKDOWN PROPERTIES

(71) Applicant: Saudi Basic Industries Corporation, Riyadh (SA)

(72) Inventors: Mohd Adnan Khan, Thuwal (SA); Husam N. Alshareef, Thuwal (SA); Ihab N. Odeh, Thuwal (SA); Mahmoud N. Almadhoun, Thuwal (SA)

(73) Assignee: Saudi Basic Industries Corporation, Riyadh (SA)

( * ) Notice: Subject to any disclaimer, the term of this patent is extended or adjusted under 35 U.S.C. 154(b) by 374 days.

(21) Appl. No.: 14/199,227

(22) Filed: Mar. 6, 2014

(65) Prior Publication Data

US 2014/0268483 A1    Sep. 18, 2014

Related U.S. Application Data

(60) Provisional application No. 61/876,033, filed on Sep. 10, 2013, provisional application No. 61/866,882, filed on Aug. 16, 2013, provisional application No. 61/784,011, filed on Mar. 14, 2013.

(51) Int. Cl.
| | | |
|---|---|---|
| *H01L 49/02* | (2006.01) | |
| *G11C 11/22* | (2006.01) | |
| *H01L 51/05* | (2006.01) | |
| *H01L 51/00* | (2006.01) | |

(52) U.S. Cl.
CPC ........... *G11C 11/22* (2013.01); *G11C 11/221* (2013.01); *H01L 28/55* (2013.01); *H01L 51/0591* (2013.01); *H01L 51/004* (2013.01); *H01L 51/0043* (2013.01); *Y10T 428/24802* (2015.01)

(58) Field of Classification Search
None
See application file for complete search history.

(56) References Cited

U.S. PATENT DOCUMENTS

| | | | | |
|---|---|---|---|---|
| 5,115,018 | A * | 5/1992 | Akkapeddi | ........... C08F 257/02 525/166 |
| 2005/0162881 | A1 | 7/2005 | Stasiak et al. | .................. 365/63 |
| 2006/0022310 | A1* | 2/2006 | Egitto | .................... B82Y 10/00 257/642 |
| 2008/0128682 | A1 | 6/2008 | Park | ................................ 257/40 |
| 2008/0248596 | A1 | 10/2008 | Das et al. | ......................... 438/3 |
| 2008/0293864 | A1* | 11/2008 | Tan | ........................ C08K 3/22 524/403 |
| 2009/0258443 | A1 | 10/2009 | Takahiro et al. | ................. 438/3 |
| 2010/0067172 | A1 | 3/2010 | Zhang et al. | ................. 361/323 |

(Continued)

OTHER PUBLICATIONS

Ellis et al., Polymers: A Property Database, Second Edition, CRC Press, Oct. 29, 2008, pp. 517-518.*

(Continued)

*Primary Examiner* — Callie E Shosho
*Assistant Examiner* — Patrick N English
(74) *Attorney, Agent, or Firm* — Norton Rose Fulbright US LLP

(57) ABSTRACT

Disclosed is a ferroelectric material and methods for its use in capacitors that includes a polymer blend of at least two polymers, wherein the first polymer is a ferroelectric polymer and the second polymer has a low dielectric constant.

30 Claims, 21 Drawing Sheets

(56) References Cited

U.S. PATENT DOCUMENTS

| | | | |
|---|---|---|---|
| 2010/0172066 A1 | 7/2010 | Baer et al. | 361/323 |
| 2011/0110015 A1 | 5/2011 | Zhang et al. | 361/311 |
| 2011/0228442 A1 | 9/2011 | Zhang et al. | 361/311 |

OTHER PUBLICATIONS

Mao et al., Ferroelectrics, Ferroelectric Properties and Polarization Switching Kinetic of Poly (vinylidene fluoride-trifluoroethylene) Copolymer, University of Texas at Dallas, Aug. 23, 2011, pp. 77-79.*

Chemicalland21, Methyl Ethyl Ketone, retrieved May 12, 2016, pp. 1-2, http://www.chemicalland21.com/industrialchem/solalc/METHYL%20ETHYL%20KETONE.htm.*

SABIC Innovative Plastics, Press Release, Aug. 29, 2012, pp. 1-2, https://www.pr.com/press-release/436912 (Year: 2012).*

Naber et al. "Organic Nonvolatile Memory Devices Based on Ferroelectricity." Adv. Mater. 2010, 22, 933.

K. Asadi et al. "Spinodal Decomposition of Blends of Semiconducting and Ferroelectric Polymers." Adv. Funct. Mater. 2011, 21, pp. 1887-1894.

M. A. Khan et al. "All-Polymer Bistable Resistive Memory Device Based on Nanoscale Phase-Separated PCBM-Ferroelectric Blends." Adv. Funct. Mater. 2012, 23, 2145-2152.

M. Li et al. "Ferroelectric Phase Diagram of PVDF:PMMA." Macromolecules. 2012, 45, 7477-7485.

M. Li et al. "Processing and Low Voltage Switching of Organic Ferroelectric Phase-Separated Bistable Diodes." Adv. Funct. Mater. 2012, 22, 2750.

Park et al. "Control of thin ferroelectric polymer films for non-volatile memory applications." IEEE Transactions on Dielectrics and Electrical Insulation. 2010, 17, 1135-1163.

M. A. Khan et al. "Fabrication and characterization of all-polymer, transparent ferrolectric capacitors on flexible substrates." Org. Electron. 2011, 12, 2225-2229.

Y. Tajitsu et al. "Investigation of Switching Characteristics of Vinylidene Fluoride/Trifluoroethylene Copolymers in Relation to Their Structures." Jpn. J. Appl. Phys. 1987, 26, 554-560.

U. S. Bhansali et al. "Electrical performance of polymer ferroelectric capacitors fabricated on plastic substrate using transparent electrodes." Org. Electron. 2012, 13, 1541-1545.

Z. Zeng et al. "Effect of Crystallinity on Polarization Fatigue of Ferroelectric P(VDF-TrFE) Copolymer Films." Chinese J. Polym. Sci. 2009, 27, 479-485.

A. A. Prabu et al. "Effect of thickness on the crystallinity and Curie transition behavior in P(VDF/TrFE) (72/28) copolymer thin films using FTIR-transmission spectroscopy ." Vib. Spectroscopy. 2009, 49, 101-109.

N. M. Reynolds et al. "Spectroscopic analysis of the electric field induced structural changes in vinylidene fluoride/trifluoroethylene copolymers." Macromolecules. 1989, 22, 1092-1100.

S. B. Gajbhiye. "Synthesis and Physico-Chemical Characterisation of Polyphenylene Oxides." IJMER. 2012, 2, 941-44.

B. C. Kim et al. "Preparation of biocatalytic nanofibres with high activity and stability via enzyme aggregate coating on polymer nanofibres." Nanotechnology. 2005, 16, S382.

N. Shimizu et al. "7-Hydroxyphthalide: A New Natural Salicylaldehyde Analog from *Oulenzia* sp. (Astigmata Winterschmitiidae)." Biosci. Biotechnol. Biochem. 2001, 65, 990-992.

Lee et al. "Flexible low voltage nonvolatile memory transistors with pentacene channel and ferroelectric polymer." Appl. Phys. Lett. 2009, 94, 093304.

Noh et al. "ZnO-based nonvolatile memory thin-film transistors with polymer dielectric/ferroelectric double gate insulators." Appl. Phys. Lett. 2007, 90, 253504.

T. Furukawa et al. "Factors governing ferroelectric switching characteristics of thin VDF/TrFE copolymer films." IEEE Transactions on Dielectrics and Electrical Insulation. 2006, 13, 1120-1131.

Jung et al. "Low-voltage-operated top-gate polymer thin-film transistors with high capacitance poly(vinylidene fluoride-trifluoroethylene)/poly(methyl methacrylate) dielectrics." J. Appl. Phys. 2010, 108, 102810.

Khan et al. "Doped polymer electrodes for high performance ferroelectric capacitors on plastic substrates." Appl. Phys. Lett. 2012, 101, 143303.

S. Ducharme et al. "Two-dimensional ferroelectric films." Nature. 1998, 391, 874.

Li et al. "Vertically stacked multi-heterostructures of layered materials for logic transistors and complementary inverters." Nat. Mater. 2013, 1.

X. Zhang et al. "Temperature dependence of coercive field and fatigue in poly(vinylidene fluoride-trifluoroethylene) copolymer ultra-thin films." J. Phys. D. Appl. Phys. 2011, 44, 155501.

S. Fujisaki et al. "Low-voltage operation of ferroelectric poly(vinylidene fluoride-trifluoroethylene) copolymer capacitors and metal-ferroelectric-insulator-semiconductor diodes." Appl. Phys. Lett. 2007, 90, 162902.

G. Zhu et al. "Electrical fatigue in ferroelectric P(VDF-TrFE) copolymer films." IEEE Transactions on Dielectrics and Electrical Insulation. 2010, 17, 1172-1177.

G. Zhu et al. "Polarization fatigue in ferroelectric vinylidene fluoride and trifluoroethylene copolymer thin films." J. Appl. Phys. 2011, 110, 024109.

H. R. Zeller. "Breakdown and pre-breakdown phenomena in solid dielectrics." IEEE Transactions on Electrical Insulation. 1987, 22, 115-122.

S. J. Kang et al. "Printable Ferroelectric PVDF/PMMA Blend Films with Ultralow Roughness for Low Voltage Non-Volatile Polymer Memory." Advanced Functional Materials, vol. 19, No. 17, pp. 2812-2818. 2009.

P. Hermans et al. "Polymer and Organic Nonvolatile Memory Devices." Chemistry of Materials, vol. 23, No. 3, pp. 341-358. 2011.

M. A. Khan et al. "High-Performance Ferroelectric Memory Based on Phase-Separated Films of Polymer Blends." Advanced Functional Materials, vol. 24, No. 10, pp. 1372-1381. 2013.

J. W. Yoon et al. "Improvement in Ferroelectric Fatigue Endurance of Poly(methyl methacrylate)-Blended Poly(vinylidene fluoride-trifluoroethylene)." Japanese Journal of Applied Physics, 49, 030201. 2010.

Q. Chen. "The Optical and Dielectric Applications of Poly(Vinylidene Fluoride) Based Electro-Active Polymers." Doctorate Dissertation. Pennsylvania State University. 2008.

Search Report and Written Opinion issued in International Application No. PCT/US2014/021091, dated May 27, 2014.

Tomer et al., *Journal of Applied Physics* 110, 044107 (2011).

* cited by examiner

FERROELECTRIC CAPACITOR WITH IMPROVED FATIGUE AND BREAKDOWN PROPERTIES

CROSS REFERENCE TO RELATED APPLICATIONS

This application claims the benefit of U.S. Provisional Patent Application No. 61/876,033, filed Sep. 10, 2013, U.S. Provisional Patent Application No. 61/866,882, filed Aug. 16, 2013, and U.S. Provisional Patent Application No. 61/784,011, filed Mar. 14, 2013. The contents of the referenced applications are incorporated into the present application by reference.

BACKGROUND OF THE INVENTION

A. Field of the Invention

The present disclosure generally relates to ferroelectric materials having improved fatigue and dielectric breakdown characteristics for use in nonvolatile memory and energy storage applications. The materials include a polymer blend that allows for the improved characteristics.

B. Description of Related Art

Memory systems are used for storage of data, program code, and/or other information in many electronic products, such as personal computer systems, embedded processor-based systems, video image processing circuits, portable phones, and the like. Important characteristics for a memory cell in electronic device are low cost, nonvolatility, high density, writability, low power, and high speed. Conventional memory solutions include Read Only Memory (ROM), Programmable Read only Memory (PROM), Electrically Programmable Memory (EPROM), Electrically Erasable Programmable Read Only Memory (EEPROM), Dynamic Random Access Memory (DRAM) and Static Random Access Memory (SRAM).

ROM is relatively low cost but cannot be rewritten. PROM can be electrically programmed but with only a single write cycle. EPROM has read cycles that are fast relative to ROM and PROM read cycles, but has relatively long erase times and reliability only over a few iterative read/write cycles. EEPROM (or "Flash") is inexpensive, and has low power consumption but has long write cycles (ms) and low relative speed in comparison to DRAM or SRAM. Flash also has a finite number of read/write cycles leading to low long-term reliability. ROM, PROM, EPROM and EEPROM are all non-volatile, meaning that if power to the memory is interrupted the memory will retain the information stored in the memory cells.

DRAM stores charge on transistor gates that act as capacitors but must be electrically refreshed every few milliseconds complicating system design by requiring separate circuitry to "refresh" the memory contents before the capacitors discharge. SRAM does not need to be refreshed and is fast relative to DRAM, but has lower density and is more expensive relative to DRAM. Both SRAM and DRAM are volatile, meaning that if power to the memory is interrupted the memory will lose the information stored in the memory cells.

Consequently, existing technologies are either non-volatile but are not randomly accessible and have low density, high cost, and limited ability to allow multiples writes with high reliability of the circuit's function, or they are volatile and complicate system design or have low density. Some technologies have attempted to address these shortcomings including ferromagnetic RAM (FRAM) which utilize a ferromagnetic region of a ferroelectric capacitor to generate a nonvolatile memory cell.

These capacitors are fabricated using two parallel conductive plates separated by a ferroelectric polymer layer. The ferroelectric polymer layer is essentially a thin layer of insulating film which contains a permanent electrical polarization that can be reversed repeatedly, by an opposing electric field. As a result, the ferroelectric capacitor has two possible non-volatile states, which they can retain without electrical power, corresponding to the two binary logic levels in a digital memory. Ferroelectric capacitors frequently use a polyvinylidene fluoride (PVDF-TrFE) copolymer as the ferroelectric material due to its large polarization value and electrical and material properties.

Ferroelectric capacitors also provide energy-storing functionality. When a voltage is applied across the plates, the electric field in the ferroelectric displaces electric charges, and thus stores energy. The amount of energy stored by a ferroelectric capacitor depends on the dielectric constant of the insulating material and the dimensions (total area and thickness) of the film, such that in order to maximize the total amount of energy that a capacitor can accumulate, the dielectric constant and breakdown voltage of the film are maximized, and the thickness of the film minimized.

While ferroelectric capacitors address many of the important characteristics for a memory cell and energy storage, they often have poor durability. For example, fatigue, due to repeated switching cycles or stress cycles, is a primary damage mechanism for these capacitors. In a ferroelectric capacitor, fatigue is the phenomenon whereby the remnant polarization value is decreased by repeated switching and deterioration of ferroelectric polarization properties. In particular, injection of charges from electrodes are often trapped at crystallite boundaries and defects, thereby inhibiting ferroelectric switching and leading to higher fatigue rates.

SUMMARY OF THE INVENTION

A solution to the problems associated with the poor durability of ferroelectric capacitors has been identified. The solution resides in the discovery and use of a ferroelectric material in capacitors. This material has improved durability when compared with existing ferroelectric materials.

In one particular aspect, there is disclosed a ferroelectric material comprising a polymer blend of at least two polymers, wherein the first polymer is a ferroelectric polymer and the second polymer has a low dielectric constant. The polymer blend can comprise a crystalline or semi-crystalline polymeric matrix of the ferroelectric polymer and a plurality of amorphous nanostructures comprising the second polymer, wherein the plurality of amorphous nanostructures are comprised (e.g., embedded) within the polymeric matrix. The plurality of nanostructures are capable of acting as charge trap regions to store charge (e.g., positive charge, negative charge, etc.). The size (e.g., width or height or both) and/or number of the plurality of nanostructures can be made dependent on the amount by weight of the second polymer added to the polymer blend. The shape of the nanostructures comprising the second polymer can vary. In one particular aspect, such nanostructures can be substantially spherical in shape (e.g., nanospheres). Further, the nanostructures can be evenly distributed throughout the polymeric matrix. The polymer blend can be a solution blend in which the at least two polymers have been dissolved in a common solvent or can be a melt blend obtained by melt blend extrusion at a common extrusion temperature that allows the two polymers to melt without significant thermal degradation. For example, the temperature used to obtain the melt blend can be above the melting point and below the thermal degradation temperatures for each of the at least two polymers. The ferroelectric polymer can be a co-polymer, such as poly(vinylidene fluoride-trifluoroethylene) (P(VDF-TrFE)). The mole ratio of VDF to TrFE can be about 80:20, 77:23, 75:25, 70:30, or 55:45 in such a co-polymer. In some instances, the dielectric constant of the second polymer can be from about 1 to about 3 or about 1, 2, or 3. In particular aspects, the second polymer can be a polyphenylene ether polymer, copolymer, or terpolymer. The structure of the polyphenylene ether can be:

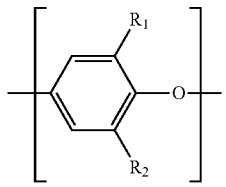

wherein the oxygen ether atom of one unit is connected to the benzene nucleus of the next adjoining unit, $R_1$ and $R_2$ are each individually a hydrogen, a halogen, a hydrocarbon radical, a halohydrocarbon radical having at least two carbon atoms between the halogen atoms and the phenyl nucleus, a hydrocarbonoxy radical, or a halohydrocarbonoxy radical having at least two carbon atoms between the halogen atom and the phenyl nucleus, or a substituted or unsubstituted phenyl group. The length of the polymer (or its molecular weight) can vary as desired to ensure the solubility of the polymer in a solvent. In other instances, the second polymer can be a polycarbonate polymer, copolymer, or terpolymer. In some aspects, the ferroelectric polymer can be polyvinylidene fluoride (PVDF), a poly(vinylidene fluoride-tetrafluoroethylene) co-polymer (P(VDF-TrFE)), or a poly(vinylidene-fluoride-co-hexafluoropropene) (P(VDF-HFP). The common solvent can be methyl-ethyl-ketone, cyclohexanone, hexanone, or a solvent that comprises a ratio of at least two solvents capable of dissolving both the first and second polymers. The ferroelectric material can be in the form of a film, a liquid, or a gel. The film can have a thickness of 20 nanometers to 10 microns or have a thickness of 20, 30, 40, 50, 100, 200, 300, 400, 500, 600, 700, 800, or 900 nanometers or 1, 2, 3, 4, 5, 6, 7, 8, 9, or 10 microns. The film can be a single monolayer film. In certain instances, the ferroelectric polymer can be in crystalline or semi-crystalline form and the second polymer can be in amorphous, semi-crystalline, or crystalline form. The ferroelectric material can include from 1% to 50% or 1% to 25%, 1% to 8%, or 6 to 8% by weight of the second polymer. In certain aspects, the ferroelectric material has a breakdown strength that is greater than the breakdown strength of P(VDF-TrFE). In other instances, the ferroelectric material has an electric breakdown strength dependent on at least the amount by weight of the second polymer present in the ferroelectric material. In one aspect, the ferroelectric material has a breakdown strength of at least about 250 MV/m and/or a dielectric constant greater than 2. The ferroelectric material can be thermally stable at a temperature of 50, 60, 70, 80, 90, 100, 110, 120, 130, 140, or 150° C. or any range therein (e.g., 50 to 150° C.). The fatigue characteristic of the ferroelectric material can be dependent on at least the amount by weight of the second polymer in the material. The ferroelectric material can exhibit a stable polarization from room temperature up to 80° C. or from greater than 50° C. up to 80° C. at 10 Hz with a polarization change of less than 5%.

In another aspect of the present invention there is disclosed a ferroelectric capacitor that includes the ferroelectric material of the present invention. The ferroelectric capacitor can include a first conductive material, and a second conductive material, wherein at least a portion of the ferroelectric material is disposed between at least a portion of the first conductive material and at least a portion of the second conductive material. The first and/or second conductive material can include a metal such as platinum, gold, aluminum, silver, or copper, or a metal oxide such as zinc oxide. In some aspects, the first and/or second conductive material can include PEDOT:PSS, polyaniline, or graphene. In other embodiments, the first and/or second conductive material can include a metal-like conductive substrate such as Indium-doped Tin Oxide (ITO). The ferroelectric capacitor can be comprised on a substrate. The substrate can be silicon, plastic, paper. In particular aspects, the substrate can be a banknote (e.g., a bill, paper money, or simply a note or promissory note). The ferroelectric capacitor can have a fatigue characteristic dependent on at least the amount by weight of the second polymer in the ferroelectric material. In particular aspects, the ferroelectric capacitor exhibits a stable polarization from room temperature up to 80° C. or from greater than 50° C. up to 80° C. at 10 Hz with a polarization change of less than 5%. The ferroelectric capacitor can maintain at least 20%, 30%, 45%, or 50%, or up to 60% of polarization capabilities after $10^6$ cycles at a frequency of 100 Hz and an applied field of 100 MV/m. In some embodiments, the ferroelectric capacitor can maintain at least 54%, 60%, 70%, or 75%, or up to 80% of polarization capabilities after $10^6$ cycles at a frequency of 100 Hz and an applied field of 100 MV/m.

In still another embodiment there is disclosed a printed circuit board or an integrated circuit comprising the ferroelectric material or the ferroelectric capacitor of the present invention. The ferroelectric material or capacitor in the printed circuit board or integrated circuit can be included in at least a portion of a communications circuit, a sensing circuit, or a control circuit. Further, electronic devices comprising the ferroelectric material or the ferroelectric capacitor of the present invention are also contemplated.

Also disclosed is a method of making the ferroelectric material of the present invention. The method can include: (1) obtaining a solution comprising a solvent, a ferroelectric polymer, and a polymer having a low dielectric constant, wherein the ferroelectric polymer and the polymer having a low dielectric constant are dissolved in the solvent; (2) disposing the solution on a substrate; and (3) subjecting the solution to a heating or annealing step under conditions sufficient to obtain the ferroelectric material. The solution can be disposed on the surface of a substrate by spray coating, spin coating, doctor blading, drop casting, ink jet printing, or gravure printing. The heating or annealing step can include subjecting the solution to a temperature ranging from 80° C. to 170° C. for 10 minutes to 6 hours. In certain instances, the heating or annealing step can include subjecting the solution to a temperature ranging from 40° C. to 90° C. for 20 to 40 minutes followed by a temperature ranging from 80° C. to 170° C. for 10 minutes to 6 hours.

In yet another embodiment, there is disclosed a method of making the ferroelectric material of the present invention comprising: (1) obtaining a ferroelectric polymer and a polymer having a low dielectric constant; (b) blend the ferroelectric polymer and the polymer having a low dielectric constant in an extruder; and (c) melt extrude the ferroelectric polymer and the polymer having a low dielectric constant under conditions sufficient to obtain the ferroelectric material. Steps (b) or (c) or both can further include subjecting the ferroelectric polymer and the polymer having a low dielectric constant to a temperature that is above the melting temperatures and below the thermal degradation temperatures of the ferroelectric polymer and the polymer having a low dielectric constant. The method can further comprise casting or disposing the ferroelectric material onto a substrate (such as those described in this application and substrates known in the art). The ferroelectric material can be casted or formed into a film having a thickness as noted throughout this specification and incorporated into the present application by reference. The method can further include subjecting the supported ferroelectric material to a heating or annealing step. The heating or annealing step can include subjecting the ferroelectric material to a temperature ranging from 80° C. to 170° C. for 10 minutes to 6 hours or from 40° C. to 90° C. for 20 to 40 minutes followed by a temperature ranging from 80° C. to 170° C. for 10 minutes to 6 hours.

In another embodiment there is disclosed a method of obtaining a specified fatigue characteristic of a ferroelectric material or a ferroelectric capacitor of the present invention. The method can include adding a specified amount of the second polymer in the ferroelectric material so as to obtain a selected or targeted specific fatigue characteristic.

Another aspect of the present invention includes a method for reading and restoring data to a nonvolatile memory cell that includes a ferroelectric capacitor of the present invention. The method can include: (1) applying a voltage to the ferroelectric capacitor; (2) increasing the voltage by a predetermined amount; (3) detecting a charge signal that results from increasing said voltage, wherein a charge signal having at least a certain minimum amplitude indicates a change in a previously set polarization state representing a first binary logic level; and (4) restoring said previously set polarization state in said ferroelectric capacitor if the polarization state has been changed, by altering a polarity of the voltage applied to said ferroelectric capacitor.

In another aspect of the present invention there is also disclosed a method for writing to a nonvolatile memory cell that includes a ferroelectric capacitor of the present invention. The method can include: (1) applying a voltage to the ferroelectric capacitor; (2) increasing said voltage by a predetermined amount; (3) detecting a charge signal that results from increasing the voltage, wherein a charge signal having at least a certain minimum amplitude indicates a change to a second polarization state representing a second binary logic level; (4) maintaining said second polarization state if said memory cell represents said second binary logic level; and (5) restoring to a first polarization state representing a first binary logic level if memory cell represents a first binary logic level, by altering a polarity the voltage applied to said ferroelectric capacitor.

In a further embodiment of the present invention there is disclosed a method of decoupling a circuit from a power supply with a ferroelectric capacitor of the present invention. The method can include disposing the ferroelectric capacitor between a power voltage line and a ground voltage line, wherein the ferroelectric capacitor is coupled to the power voltage line and to the ground voltage line, and wherein a reduction in power noise generated by the power voltage and the ground voltage is achieved.

Also disclosed is a method for operating an energy storage circuit that includes a ferroelectric capacitor of the present invention, which provides electrical power to a consuming device when electrical power from a primary source is unavailable. The method can include: (1) defining a target energy level for the ferroelectric capacitor, wherein the target energy level is based on a selected material weight percentage of the second polymer in the ferroelectric material; (2) charging the ferroelectric capacitor; (3) measuring a first amount of energy that is stored in the ferroelectric capacitor during charging; (4) terminating charging of the ferroelectric capacitor when the first amount of energy stored in the capacitor reaches the target energy level; and (5) discharging the capacitor into the consuming device when electrical power from the primary source becomes unavailable.

Also disclosed is embodiments 1-61 as follows. Embodiment 1 to a ferroelectric material comprising a polymer blend of at least two polymers, wherein the first polymer is a ferroelectric polymer and the second polymer has a low dielectric constant. Embodiment 2 is the ferroelectric material of Embodiment 1, wherein the polymer blend is a solution blend in which the at least two polymers have been dissolved in a common solvent. Embodiment 3 is the ferroelectric material of Embodiment 2, wherein the common solvent is methyl-ethyl-ketone, cyclohexanone, hexanone, or a solvent that comprises a ratio of at least two solvents capable of dissolving both the first and second polymers. Embodiment 4 is the ferroelectric material of Embodiment 1, wherein the polymer blend is a melt blend. Embodiment 5 is the ferroelectric material of Embodiment 4, wherein the temperature used to obtain the melt blend is above the melting point and below the thermal degradation temperatures for each of the at least two polymers. Embodiment 6 is the ferroelectric material of any one of Embodiments 1 to 5, wherein the ferroelectric polymer is a co-polymer. Embodiment 7 is the ferroelectric material of Embodiment 6, wherein the co-polymer is poly(vinylidene fluoride-trifluoroethylene) (P(VDF-TrFE)). Embodiment 8 is the ferroelectric material of Embodiment 7, wherein the mole ratio of VDF to TrFE is about 80:20, 77:23, 75:25, 70:30, or 55:45. Embodiment 9 is the ferroelectric material of any one of Embodiment 1 to 8, wherein the dielectric constant of the second polymer is between about 1 to 3. Embodiment 10 is the ferroelectric material of Embodiment 9, wherein the second polymer is a polyphenylene polymer, copolymer, or terpolymer or a polycarbonate polymer, copolymer, or terpolymer. Embodiment 11 is the ferroelectric material of Embodiment 10, wherein the polyphenylene ether has the following structure:

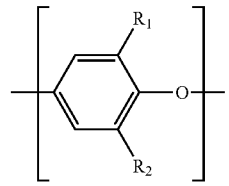

wherein the oxygen ether atom of one unit is connected to the benzene nucleus of the next adjoining unit, $R_1$ and $R_2$ are each individually a hydrogen, a halogen, a hydrocarbon radical, a halohydrocarbon radical having at least two carbon atoms between the halogen atoms and the phenyl nucleus, a hydrocarbonoxy radical, a halohydrocarbonoxy radical having at least two carbon atoms between the halogen atom and the phenyl nucleus, or a substituted or unsubstituted phenyl group. Embodiment 12 is the ferroelectric material of Embodiment 11, wherein the polyphenylene ether is poly (2,6-dimethyl-1,4-phenylene oxide). Embodiment 13 is the ferroelectric material of Embodiment 11, wherein the polyphenylene ether is Noryl™ SA90 Resin or Noryl™ SA9000 Resin or a combination thereof. Embodiment 14 is the ferroelectric material of any one of Embodiment 1 to 13, wherein the ferroelectric polymer is polyvinylidene fluoride (PVDF), a poly(vinylidene fluoride-tetrafluoroethylene) copolymer (P(VDF-TrFE)), or a poly(vinylidene-fluoride-co-hexafluoropropene) (P(VDF-HFP)). Embodiment 15 is the ferroelectric material of any one of Embodiment 1 to 14, wherein the material is a film. Embodiment 16 is the ferroelectric material of Embodiment 15, wherein the thickness of the film is 20 nanometers to 10 microns. Embodiment 17 is the ferroelectric material of any one of Embodiment 15 to 16, wherein the film is a single monolayer film. Embodiment 18 is the ferroelectric material of any one of Embodiments 1 to 17, wherein the ferroelectric polymer is in crystalline or semi-crystalline form. Embodiment 19 is the ferroelectric material of any one of Embodiments 1 to 18, wherein the second polymer is in amorphous, semi-crystalline, or crystalline form. Embodiment 20 is the ferroelectric material of any one of Embodiment 1 to 19, wherein the polymer blend comprises a crystalline or semi-crystalline polymeric matrix of the ferroelectric polymer and a plurality of amorphous nanostructures comprising the second polymer, wherein the plurality of amorphous nanostructures are comprised within the polymeric matrix. Embodiment 21 is the ferroelectric material of Embodiment 20, wherein the plurality of nanostructures are charge trap regions that are capable of storing charge. Embodiment 22 is the ferroelectric material of any one of Embodiments 20 to 21, wherein the size and number of the plurality of nanostructures are dependent on the amount by weight of the second polymer in the polymer blend. Embodiment 23 is the ferroelectric material of any one of Embodiments 20 to 22, wherein the plurality of amorphous nanostructures are nanospheres. Embodiment 24 is the ferroelectric material of any one of Embodiment 1 to 23, wherein the material is a liquid, a gel, or a melt. Embodiment 25 is the ferroelectric material of any one of Embodiments 1 to 24, wherein the material comprises from 1% to 50% or 1% to 25%, 1% to 8%, or 6 to 8% by weight of the second polymer. Embodiment 26 is the ferroelectric material of any one of Embodiments 1 to 25, wherein the material comprises a breakdown strength that is greater than the breakdown strength of P(VDF-TrFE). Embodiment 27 is the ferroelectric material of any one of Embodiments 1 to 26, wherein the material comprises an electric breakdown strength dependent on at least the amount by weight of the second polymer in the material. Embodiment 28 is the ferroelectric material of any one of Embodiments 1 to 27, wherein the material has a breakdown strength of at least about 250 MV/m and/or a dielectric constant greater than 2. Embodiment 29 is the ferroelectric material of any one of Embodiments 1 to 28, wherein the material is thermally stable at a temperature of 50, 60, 70, 80, 90, 100, 110, 120, 130, 140, or 150° C. or any range therein. Embodiment 30 is the ferroelectric material of any one of Embodiments 1 to 29, wherein the material comprises a fatigue characteristic dependent on at least the amount by weight of the second polymer in the material. Embodiment 31 is the ferroelectric material of any one of Embodiment 1 to 30, wherein the material exhibits a stable polarization from room temperature up to 80° C. or from greater than 50° C. up to 80° C. at 10 Hz with a polarization change of less than 5%. Embodiment 32 is ferroelectric capacitor comprising the ferroelectric material of any one of Embodiments 1 to 31, a first conductive material, and a second conductive material, wherein at least a portion of the ferroelectric material is disposed between at least a portion of the first conductive material and at least a portion of the second conductive material. Embodiment 33 is the ferroelectric capacitor of Embodiment 32, wherein the first and/or second conductive material comprises a metal such as platinum, gold, aluminum, silver, or copper, or a metal oxide such as zinc oxide. Embodiment 34 is the ferroelectric capacitor of any one of Embodiments 32 to 33, wherein first and/or second conductive material comprises PEDOT:PSS, polyaniline, graphene, conductive micro- or nano-structures or a layer or film of conductive micro- or nano-structures on or imbedded in the surface of a substrate such as a polymer substrate. Embodiment 35 is the ferroelectric capacitor of any one of Embodiments 32 to 34, wherein the first and/or second conductive material comprises a metal-like conductive substrate such as Indium-doped Tin Oxide (ITO). Embodiment 36 is the ferroelectric capacitor of any one of Embodiments 32 to 35, wherein the ferroelectric capacitor is comprised on a substrate. Embodiment 37 is the ferroelectric capacitor of Embodiment 36, wherein the substrate comprises silicon, plastic, paper, or wherein the substrate is a banknote. Embodiment 38 is the ferroelectric capacitor of any one of Embodiments 32 to 37, wherein the capacitor comprises a fatigue characteristic dependent on at least the amount by weight of the second polymer in the ferroelectric material. Embodiment 39 is the ferroelectric capacitor of any one of Embodiments 32 to 38, wherein the capacitor exhibits a stable polarization from room temperature up to 80° C. or from greater than 50° C. up to 80° C. at 10 Hz with a polarization change of less than 5%. Embodiment 40 is the ferroelectric capacitor of any one of Embodiment 32 to 39, wherein the capacitor maintains at least 20%, 30%, 45%, or 50%, or up to 60% of polarization capabilities after $10^6$ cycles at a frequency of 100 Hz and an applied field of 100 MV/m. Embodiment 41 is the ferroelectric capacitor of any one of Embodiments 32 to 40, wherein the capacitor maintains at least 54%, 60%, 70%, or 75%, or up to 80% of polarization capabilities after $10^6$ cycles at a frequency of 100 Hz and an applied field of 100 MV/m. Embodiment 42 is a printed circuit board comprising the ferroelectric material of any one of Embodiments 1 to 31 or the ferroelectric capacitor of any one of Embodiments 32 to 41. Embodiment 43 is the printed circuit board of Embodiment 42, wherein the ferroelectric material or capacitor is comprised in at least a portion of a communications circuit, a sensing circuit, or a control circuit. Embodiment 44 is an integrated circuit comprising the ferroelectric material of any one of Embodiments 1 to 31 or the ferroelectric capacitor of any one of Embodiments 32 to 41. Embodiment 45 is the integrated circuit of Embodiment 44, wherein the ferroelectric material or capacitor is comprised in at least a portion of a communications circuit, a sensing circuit, or a control circuit. Embodiment 46 is an electronic device comprising the ferroelectric material of any one of Embodiments 1 to 31 or the ferroelectric capacitor of any one of c Embodiments 32 to 41. Embodiment 47 is a method of making the ferroelectric material of any one of Embodiments 1 to 31 comprising: (a) obtaining a solution comprising a solvent, a ferroelectric polymer, and a polymer having a low dielectric constant, wherein the ferroelectric polymer and the polymer having a low dielectric constant are dissolved in the solvent; (b) disposing the solution on a substrate; and (c) subjecting the solution to a heating or annealing step under conditions sufficient to obtain the ferroelectric material. Embodiment 48 is the method of Embodiment 47, wherein the solution is disposed on the surface of a substrate by spray coating, spin coating, doctor blading, drop casting, ink jet printing, or gravure printing. Embodiment 49 is the method of any one of Embodiments 47 to 48, wherein the heating or annealing step comprises subjecting the solution to a temperature ranging from 80° C. to 170° C. for 10 minutes to 6 hours. Embodiment 50 is the method of Embodiment 49, wherein the heating or annealing step comprises subjecting the solution to a temperature ranging from 40° C. to 90° C. for 20 to 40 minutes followed by a temperature ranging from 80° C. to 170° C. for 10 minutes to 6 hours. Embodiment 51 is a method of making the ferroelectric material of any one of Embodiments 1 to 31 comprising: (a) obtaining a ferroelectric polymer and a polymer having a low dielectric constant; (b) blend the ferroelectric polymer and the polymer having a low dielectric constant in an extruder; and (c) melt extrude the ferroelectric polymer and the polymer having a low dielectric constant under conditions sufficient to obtain the ferroelectric material. Embodiment 52 is the method of Embodiment 51, wherein step (b) or step (c) or both comprise subjecting the ferroelectric polymer and the polymer having a low dielectric constant to a temperature that is above the melting temperatures and below the thermal degradation temperatures of the ferroelectric polymer and the polymer having a low dielectric constant. Embodiment 53 is the method of any one of Embodiments 51 or 52, further comprising casting the ferroelectric material onto a substrate. Embodiment 54 is the method of Embodiment 53, wherein the ferroelectric material is casted in the form of a film. Embodiment 55 is the method of any one of Embodiments 53 or 54, further comprising subjecting the ferroelectric material to a heating or annealing step. Embodiment 56 is the method of Embodiment 55, wherein the heating or annealing step comprises subjecting the ferroelectric material to a temperature ranging from 80° C. to 170° C. for 10 minutes to 6 hours or from 40° C. to 90° C. for 20 to 40 minutes followed by a temperature ranging from 80° C. to 170° C. for 10 minutes to 6 hours. Embodiment 57 is A method of obtaining a specified fatigue characteristic of the ferroelectric material of any one of Embodiments 1 to 31 or the ferroelectric capacitor of any one of Embodiments 32 to 41, the method comprising adding a specified amount of the second polymer in the ferroelectric material that corresponds to the specific fatigue characteristic. Embodiment 58 is a method for reading and restoring data to a nonvolatile memory cell comprising any one of the ferroelectric capacitors of Embodiments 32 to 41, the method comprising: (a) applying a voltage to the ferroelectric capacitor; (b) increasing the voltage by a predetermined amount; (c) detecting a charge signal that results from increasing said voltage, wherein a charge signal having at least a certain minimum amplitude indicates a change in a previously set polarization state representing a first binary logic level; and (d) restoring said previously set polarization state in said ferroelectric capacitor if the polarization state has been changed, by altering a polarity of the voltage applied to said ferroelectric capacitor. Embodiment 59 is a method for writing to a nonvolatile memory cell comprising any one of the ferroelectric capacitors of Embodiments 32 to 41, the method comprising: (a) applying a voltage to the ferroelectric capacitor; (b) increasing said voltage by a predetermined amount; (c) detecting a charge signal that results from increasing the voltage, wherein a charge signal having at least a certain minimum amplitude indicates a change to a second polarization state representing a second binary logic level; (d) maintaining said second polarization state if said memory cell represents said second binary logic level; and (e) restoring to a first polarization state representing a first binary logic level if memory cell represents a first binary logic level, by altering a polarity the voltage applied to said ferroelectric capacitor. Embodiment 60 is a method of decoupling a circuit from a power supply with any one of the ferroelectric capacitors of Embodiments 32 to 41, the method comprising disposing the ferroelectric capacitor between a power voltage line and a ground voltage line, wherein the ferroelectric capacitor is coupled to the power voltage line and to the ground voltage line, and wherein a reduction in power noise generated by the power voltage and the ground voltage is achieved. Embodiment 61 is a method for operating an energy storage circuit comprising any one of the ferroelectric capacitors of Embodiments 32 to 41 which provides electrical power to a consuming device when electrical power from a primary source is unavailable, said method comprising: (a) defining a target energy level for the ferroelectric capacitor, wherein the target energy level is based on a selected material weight percentage of the second polymer in the ferroelectric material; (b) charging the ferroelectric capacitor; (c) measuring a first amount of energy that is stored in the ferroelectric capacitor during charging; (d) terminating charging of the ferroelectric capacitor when the first amount of energy stored in the capacitor reaches the target energy level; and (e) discharging the capacitor into the consuming device when electrical power from the primary source becomes unavailable.

The phrase "low dielectric constant" when referring to a polymer, includes a polymer having a dielectric constant of 4 or less.

The phrase "polymer blend" includes at least two polymers that have been blended together by any of the known techniques for producing polymer blends. Such techniques include solution blending using a common solvent or melt blend extrusion whereby the components are blended at temperatures above the melting point of the polymers and the obtained mixture is subsequently extruded into granules or directly into sheets or any other suitable form. Screw extruders or mills are commonly used for melt blending polymers. It will also be appreciated the blend of polymers may be a simple powder blend providing that the blend is subjected to a homogenising process before or during the process of fabricating the ferroelectric material of the present invention. Thus, for example, where a ferroelectric material is formed from at least two polymers in a screw-fed injection-molding machine, the feed to the hopper of the screw may be a simple mixture of the two polymers since a blend may be achieved in the screw portion of the machine.

The term "polymer" includes oligomers (e.g., a polymer having 2 to 10 monomeric units or 2 to 5 monomeric units) and polymers (e.g., a polymer having greater than 10 monomeric units).

The term "about" or "approximately" are defined as being close to as understood by one of ordinary skill in the art, and in one non-limiting embodiment the terms are defined to be within 10%, preferably within 5%, more preferably within 1%, and most preferably within 0.5%.

The use of the word "a" or "an" when used in conjunction with the term "comprising" in the claims or the specification may mean "one," but it is also consistent with the meaning of "one or more," "at least one," and "one or more than one."

The words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps.

The term "coupled" is defined as connected, although not necessarily directly, and not necessarily mechanically.

"Nanostructure" refers to an object or material in which at least one dimension of the object or material is equal to or less than 100 nm (e.g., one dimension is 1 to 100 nm in size). In a particular aspect, the nanostructure includes at least two dimensions that are equal to or less than 100 nm (e.g., a first dimension is 1 to 100 nm in size and a second dimension is 1 to 100 nm in size). In another aspect, the nanostructure includes three dimensions that are equal to or less than 100 nm (e.g., a first dimension is 1 to 100 nm in size, a second dimension is 1 to 100 nm in size, and a third dimension is 1 to 100 nm in size). The shape of the nanostructure can be of a wire, a particle, a sphere, a rod, a tetrapod, a hyper-branched structure, or mixtures thereof.

The ferroelectric material, electrode layers, ferroelectric capacitor, and electronic devices of the present invention can "comprise," "consist essentially of," or "consist of" particular ingredients, components, compositions, etc. disclosed throughout the specification. With respect to the transitional phase "consisting essentially of," in one non-limiting aspect, a basic and novel characteristic of the ferroelectric material of the present invention is its fatigue characteristics.

Other objects, features and advantages of the present invention will become apparent from the following figures, detailed description, and examples. It should be understood, however, that the figures, detailed description, and examples, while indicating specific embodiments of the invention, are given by way of illustration only and are not meant to be limiting. Additionally, it is contemplated that changes and modifications within the spirit and scope of the invention will become apparent to those skilled in the art from this detailed description.

DETAILED DESCRIPTION OF THE INVENTION

Historically fatigue has been a significant problem with the use of polymer ferroelectric memory. In particular, injection of charges from electrodes which are subsequently trapped at crystallite boundaries and defects, inhibit ferroelectric switching and lead to higher fatigue rates.

However, an improved ferroelectric material for capacitors has been discovered that addresses the drawbacks of current polymer ferroelectric memory. In particular, fatigue characteristics in a ferroelectric capacitor may be improved by blending a polymer having a low dielectric constant to a ferroelectric polymer. The blend can be produced by having these polymers dissolved in a common solvent, by melt blend extrusion or by other methods known in the art that can create a homogenous polymer blend. As illustrated in non-limiting embodiments in the Examples, this blend can reduce charge trapping, thereby leading to improvements in fatigue and dielectric breakdown characteristics of capacitors using said material.

These and other non-limiting aspects of the present invention are discussed in further detail in the following sections.

A. Ferroelectric Capacitor

Figure 1A:
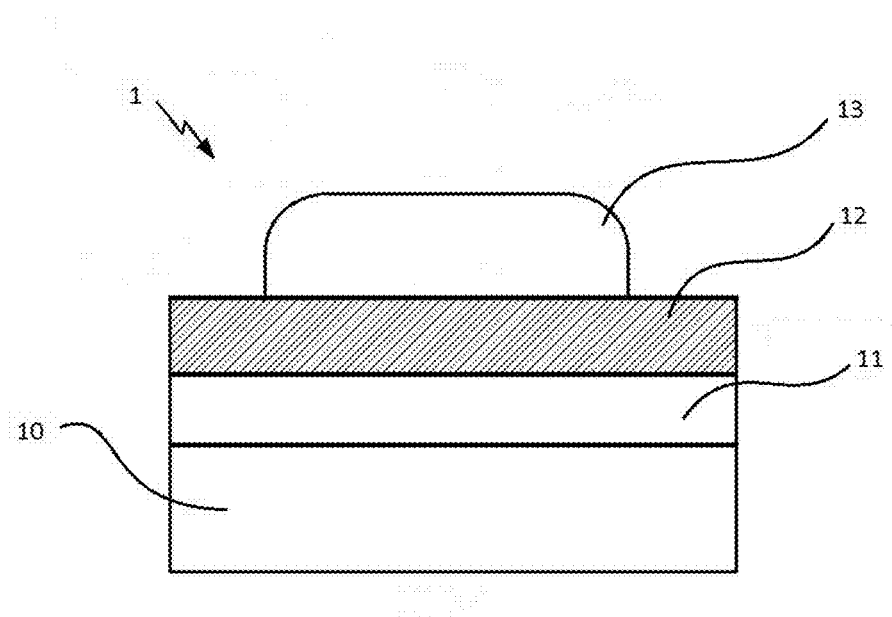
FIGS. 1(*a*)-(*b*): Schematic 2-D (a) and 3-D (b) cross section of a ferroelectric capacitor incorporating the blend of a ferroelectric polymer and a second polymer having a low dielectric constant of the present invention.
Figure 1B:
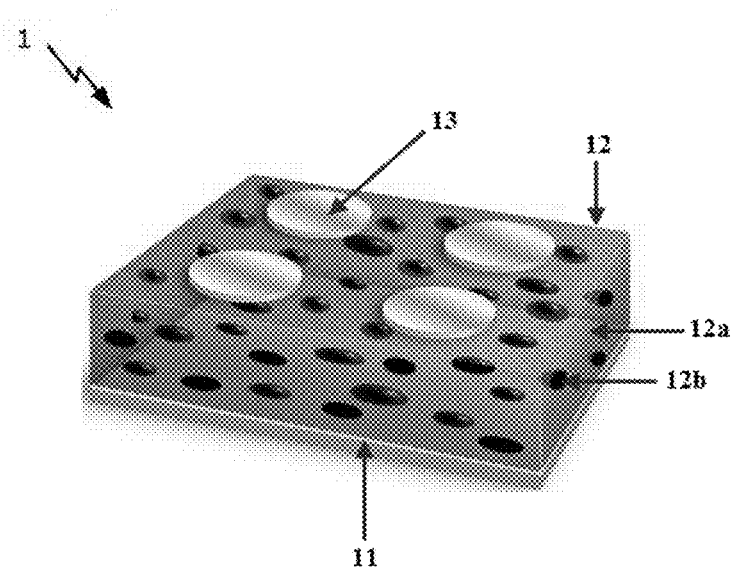

FIG. 1(a) is a 2-D cross-sectional view of a ferroelectric capacitor (1) comprising a ferroelectric material (12) of the present invention. For the purposes of FIG. 1(a), the ferroelectric material (12) is in the form of a film or layer. The ferroelectric capacitor (1) can include a substrate (10), a lower electrode (11), a ferroelectric material (12), and an end electrode (13). The ferroelectric capacitor can be fabricated on substrates by sandwiching a ferroelectric material (12) between two conducting electrodes (11) and (13). Additional materials, layers, and coatings (not shown) known to those of ordinary skill in the art can be used with the ferroelectric capacitor (1), some of which are described below. FIG. 1(b) is a 3-D cross-sectional view of the ferroelectric capacitor and does not include a substrate (10).

The ferroelectric capacitor in FIG. 1 is said to have "memory" because, at zero volts, it has two polarization states that do not decay back to zero. These polarization states can be used to represent a stored value, such as binary 0 or 1, and are read by applying an electric field. The amount of charge needed to flip the polarization state to the opposite state can be measured and the previous polarization state is revealed. This means that the read operation changes the polarization state, and can be followed by a corresponding write operation, in order to write back the stored value by again altering the polarization state.

1. Substrate (10)

The substrate (10) is used as support. It is typically made from material that is not easily altered or degraded by heat or organic solvents. Non-limiting examples of such materials include inorganic materials such as silicon, plastic, paper, banknotes as well as SABIC substrates including Polyethylene terephthalate, polycarbonates, and polyetherimide substrates.

2. Lower Electrode and Upper Electrodes (11) and (13)

The lower electrode (11) is made of a conductive material. Typically, the lower electrode (11) is obtained by forming a film using such a material (e.g., vacuum deposition, sputtering, ion-plating, plating, coating, etc.). Non-limiting examples of conductive material that can be used to form a film include gold, platinum, silver, aluminum and copper, iridium, iridium oxide, and the like. In addition, non-limiting examples of conductive polymer materials include conducting polymers (such as PEDOT: PSS, Polyaniline, graphene etc.), and polymers made conductive by inclusion of conductive micro- or nano-structures (such as silver nanowires). The thickness of the film for the lower electrode (11) is typically between 20 nm to 500 nm.

The upper electrode (13) can be disposed on the ferroelectric material (12) by thermally evaporating through a shadow mask. The material used for the upper electrode (13) can be conductive. Non-limiting examples of such materials include metals, metal oxides, and conductive polymers (e.g., polyaniline, polythiophene, etc.) and polymers made conductive by inclusion of conductive micro- or nano-structures such as those discussed above in the context of the lower electrode (11). The upper electrode (13) can be a single layer or laminated layers formed of materials each having a different work function. Further, it may be an alloy of one or more of the materials having a low work function and at least one selected from the group consisting of gold, silver, platinum, copper, manganese, titanium, cobalt, nickel, tungsten, and tin. Examples of the alloy include a lithium-aluminum alloy, a lithium-magnesium alloy, a lithium-indium alloy, a magnesium-silver alloy, a magnesium-indium alloy, a magnesium-aluminum alloy, an indium-silver alloy, and a calcium-aluminum alloy. The film thickness of the upper electrode (13) is typically between 20 nm to 500 nm.

3. Ferroelectric Material (12)

The ferroelectric material (12) can be interposed between the lower electrode (10) and the upper electrode (13). In one instance, the material (12) can be obtained from a blend of a ferroelectric polymer and a polymer having a low dielectric constant, wherein the polymers have been solubilized in the same solvent or solvent system. In the examples, the ferroelectric polymer that was used was P(VDF-TrFE), and the polymer with a low dielectric constant that was used was a polyphenylene ether sold under the trade name Noryl™ SA90 Resin by SABIC Innovative Plastics Holding BV ("SABIC") (Pittsfield, Mass., USA). Noryl™ SA90 Resin has the following structure.

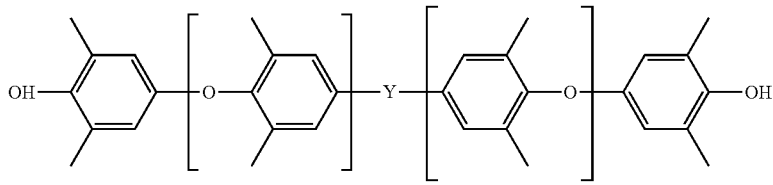

The Noryl™ SA90 Resin is in powedered form. It has an intrinsic viscosity (IV) of about 9 ml/g, a molecular weight (MW) of about 1700 g/mol, a glass transistion temperature (Tg) of 135° C., and a specific gravity of 1.02 g/cm³. However, and as noted above, other types of ferroelectric polymers and low dielectric constant polymers are also contemplated as being useful. By way of example only, all of the various SABIC PPO* Resins and Noryl® Resins (e.g., polyphenylene ether and high impact polystyrene, polyphenylene ether and polystyrene, etc.) are also contemplated as being useful in the context of the present invention. For instance, SABIC's Noryl™ SA9000 Resin can be used, which has the following structure:

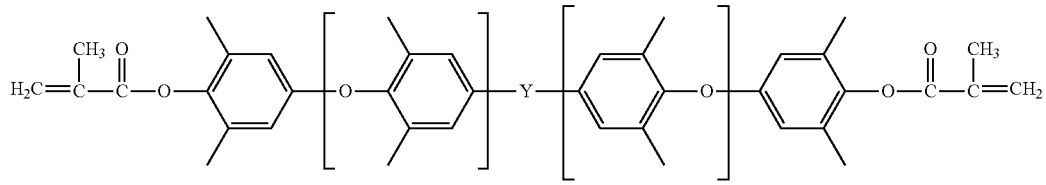

The Noryl™ SA9000 Resin is in powedered form. It has an intrinsic viscosity (IV) of about 9 ml/g, a molecular weight (MW) of about 1700 g/mol, a glass transistion temperature (Tg) of 154° C., and a specific gravity of 1.02 g/cm³. The amount of the polymer with a low dielectric constant that can be added to the ferroelectric material (12) can vary so as to achieve a desired result or fatigue characteristic of the resulting capacitor (1). For instance, the amount of the polymer with a low dielectric constant can range from 1 wt % to 50 wt % based on the total weight of the ferroelectric material (12). This allows for the creation of capacitors to have pre-defined fatigue characteristics in a relatively easy and scalable manner. Without wishing to be bound by theory, it is believed that by blending a polymer having a low dielectric constant with a ferroelectric polymer results in a blend that includes good charge trap regions and does not allow charge carriers to move freely through the film. This directly affects thermal stability of the blend, thus leading to reliably switching the polarization even at elevated temperatures close to the Curie temperature. These characteristics can be modified by increasing or decreasing the amount of the low dielectric constant polymer present in the ferroelectric material (12).

The blend film layer can be deposited by obtaining a solution that includes a solvent and the polymers of the present invention solubilized therein. The blend solutions is prepared in a common solvent which dissolves both ferroelectric polymer and polymer having the low dielectric constant. Non-limiting examples of such solvents include Methyl Ethyl Ketone, Di-methylformamide, Acetone, Di-mehtyl sulfoxide, Cyclohexanone, Tetrahydrofuran (THF). The solution can be deposited by doctor blade coating, spin coating, meniscus coating, transfer printing, ink jet printing, offset printing, screen printing process, dip coating, casting, bar coating, roll coating, wire bar coating, spraying, screen printing, gravure printing, flexo printing, offset printing, gravure offset printing, dispenser coating, nozzle coating, capillary coating, etc. Alternatively, and as explained above, other processes such as melt blend extrusion can also be used to create the polymer blend As illustrated in FIG. 1(b), the ferroelectric material (12) can be such that the ferroelectric polymer forms a crystalline or semi-crystalline polymer matrix (12a). The polymer having a low dielectric constant can phase separate from the matrix (12a) such that a plurality of separated regions (12b) are formed within the matrix that include the polymer having the lower dielectric constant. The polymer within these regions (12b) can be in amorphous form. The regions (12b) can have a variety of sizes (e.g., nano-sized, micro-sized, etc.) and shapes (e.g., spherical, substantially spherical, etc.) and can be distributed throughout the polymeric matrix (12a). The plurality of regions (12b) are capable of acting as charge-trap regions to store charge (e.g., positive charge, negative charge, etc.). The plurality of regions (12a) can also reduce or prevent charge carriers to move freely throughout the polymeric matrix (12a). As explained above and in the examples, these features can improve the thermal stability of the ferroelectric material (12) and lead to reliable switching of the polarization even at elevated temperatures close to the Curie temperature. Such features can be modified or tuned as desired by increasing or decreasing the amount of the low dielectric constant polymer that is included the ferroelectric material (12).

B. Embodiment of Process for Producing Ferroelectric Capacitor

For example, with reference to FIG. 1, a ferroelectric capacitor (1) can be fabricated on a silicon substrate (10) by disposing a ferroelectric material (12) between two conducting electrodes (11) and (13). A Pt-coated silicon substrate can be used and cleaned with acetone, IPA and DI water prior to device fabrication. A 2 wt % pure solution of P(VDF-TrFE) can be prepared by dissolving 20 mg/mL of the P(VDF-TrFE) copolymer in methyl-ethyl-ketone (MEK) solvent. Blend solutions of P(VDF-TrFE) and the Noryl™ SA90 Resin can be made by adding different amounts of Resin to the P(VDF-TrFE) solution. The amount may vary as desired to alter the concentration of the Noryl™ SA90 Resin from 1 wt % to 50 wt %. Various substitutions, modifications, additions, and/or rearrangements within the spirit and/or scope of the underlying inventive concept will become apparent to those skilled in the art from this disclosure. For example, the concentration of P(VDF-TrFE) can also be varied from 0.1 wt % to 50 wt % depending on the desired thickness of the film.

The ferroelectric material (12) can be spun from the solution by spin coating at 4000 rpm for 60 seconds. The spin coating can be varied from 500 rpm to 8000 rpm and 10 seconds to 100 seconds. The film can then be annealed on a hotplate for 30 minutes at 80° C. prior to annealing in a vacuum furnace at 135° C. for 4 hours to improve the crystallinity. Annealing time can be varied from 30 minutes to 8 hours. Finally, a top gold electrode can be thermally evaporated through a shadow mask.

The process of the present invention can efficiently produce high-performance ferroelectric capacitors in large-scale quantities.

C. Applications for Ferroelectric Capacitor

Any one of the ferroelectric capacitors of the present invention can be used in a wide array of technologies and devices including but not limited to: smartcards, RFID cards/tags, memory devices, non-volatile memory, stand-alone memory, firmware, microcontrollers, gyroscopes, acoustics sensors, actuators, microgenerators, power supply circuits, circuit coupling and decoupling, RF filtering, delay circuits, and RF tuners. If implemented in memory, including firmware, functions may be stored in the ferroelectric capacitors as one or more instructions or code on a computer-readable medium. Examples include computer-readable media encoded with a data structure and computer-readable media encoded with a computer program. Computer-readable media includes physical computer storage media. Combinations of the above should also be included within the scope of computer-readable media.

In many of these applications thin films of ferroelectric materials are typically used, as this allows the field required to switch the polarization to be achieved with a moderate voltage. Although some specific circuitry has been set forth, it will be appreciated by those skilled in the art that not all of the disclosed circuitry is required to practice the disclosure. Moreover, certain well known circuits have not been described, to maintain focus on the disclosure.

Improvements in the dielectric breakdown of the ferroelectric capacitor of the present invention also allow for improved energy storage characteristics which can be used in many applications. As the polymer with a low dielectric constant (e.g., Noryl™ SA90 Resin, Noryl™ SA9000 Resin, Noryl™ PPO* Resins, etc.) wt % is increased for the ferroelectric material of the present invention, the electric breakdown field also increases. As a result, pursuant to the energy density equation below, the maximum volumetric energy density stored in the ferroelectric capacitor also increases:

$$U_{max} = \frac{1}{2} E_{BD}^2 \varepsilon_0 \varepsilon_r$$

$E_{BD}$=Electric breakdown field strength (V m$^{-1}$)
$\varepsilon_0$=permittivity of free space=8.854×10$^{-12}$ F m$^{-1}$
$\varepsilon_r$=Dielectric permittivity.

These energy storage improvements can be incorporated in numerous applications including energy/charge storing devices for electric flashes, defibrillator, electromagnetic forming, Marx generators, pulsed lasers (including TEA lasers), pulse forming networks, radar, as well as elements in electric circuits including frequency tuners and filters in power supplies. In addition, these ferroelectric capacitors may be used in electronic devices containing volatile memory which require a power supply to prevent the loss of information if a power source is changed or removed.

Figure 2:
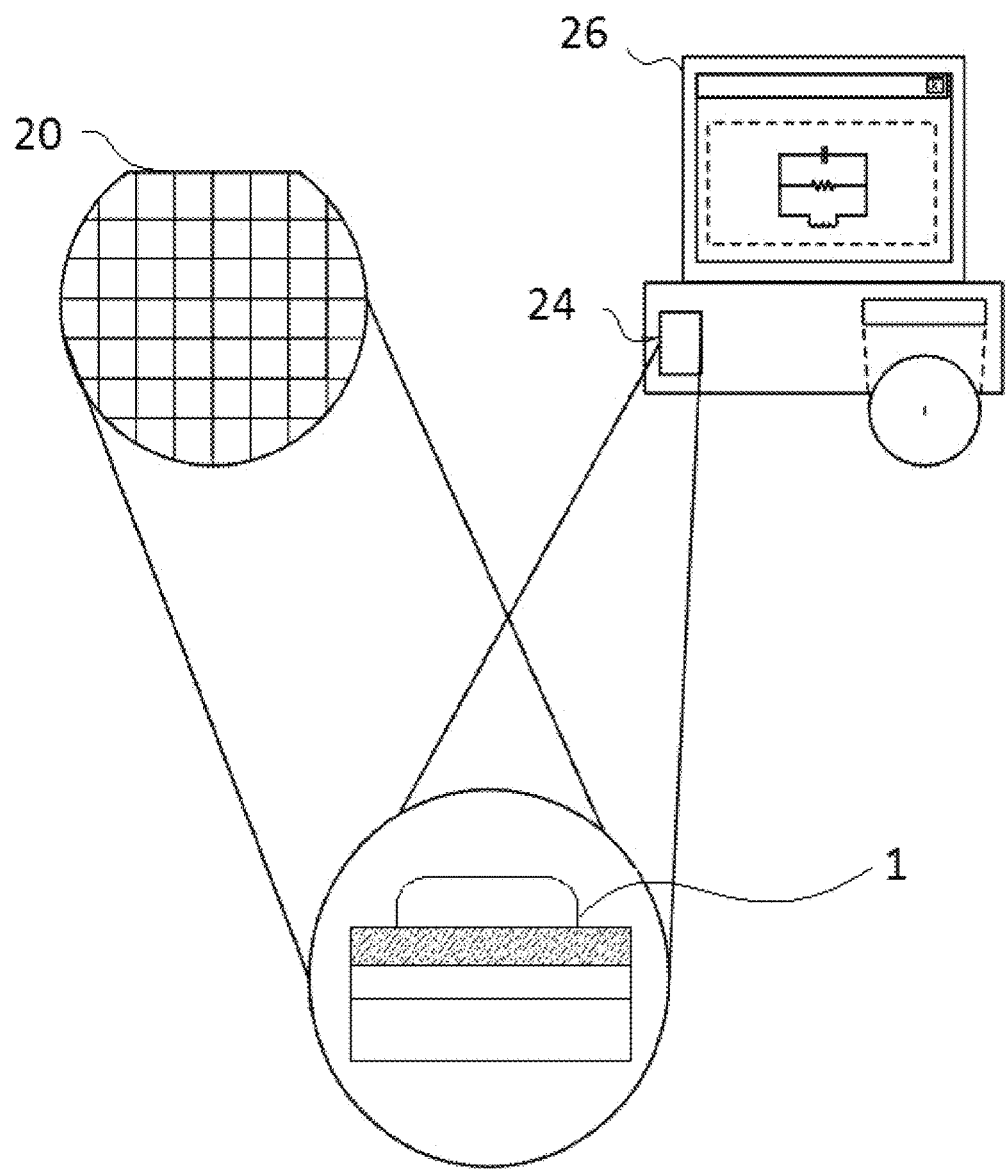
FIG. 2: Block diagram illustrating implementation of a circuit in a semiconductor wafer or an electronic device using ferroelectric capacitors of the present invention.

FIG. 2 is block diagram illustrating implementation of an integrated circuit in a semiconductor wafer or an electronic device according to one embodiment. In one case, a ferroelectric capacitor (1) with improved fatigue characteristics as discussed above may be found in a wafer (20). The wafer (20) may be singulated into one or more dies that may contain the ferroelectric capacitor (1). Additionally, the wafer (20) may experience further semiconductor manufacturing before singulation. For example, the wafer (20) may be bonded to a carrier wafer, a packaging bulk region, a second wafer, or transferred to another fabrication facility. Alternatively, an electronic device (26) such as, for example, a personal computer, may include a memory device (24) that includes the ferroelectric capacitor (1). Additionally, other parts of the electronic device (26) may include the ferroelectric capacitor (1) such as a central processing unit (CPU), a digital-to-analog converter (DAC), an analog-to-digital converter (ADC), a graphics processing unit (GPU), a microcontroller, or a communications controller.

Figure 3:
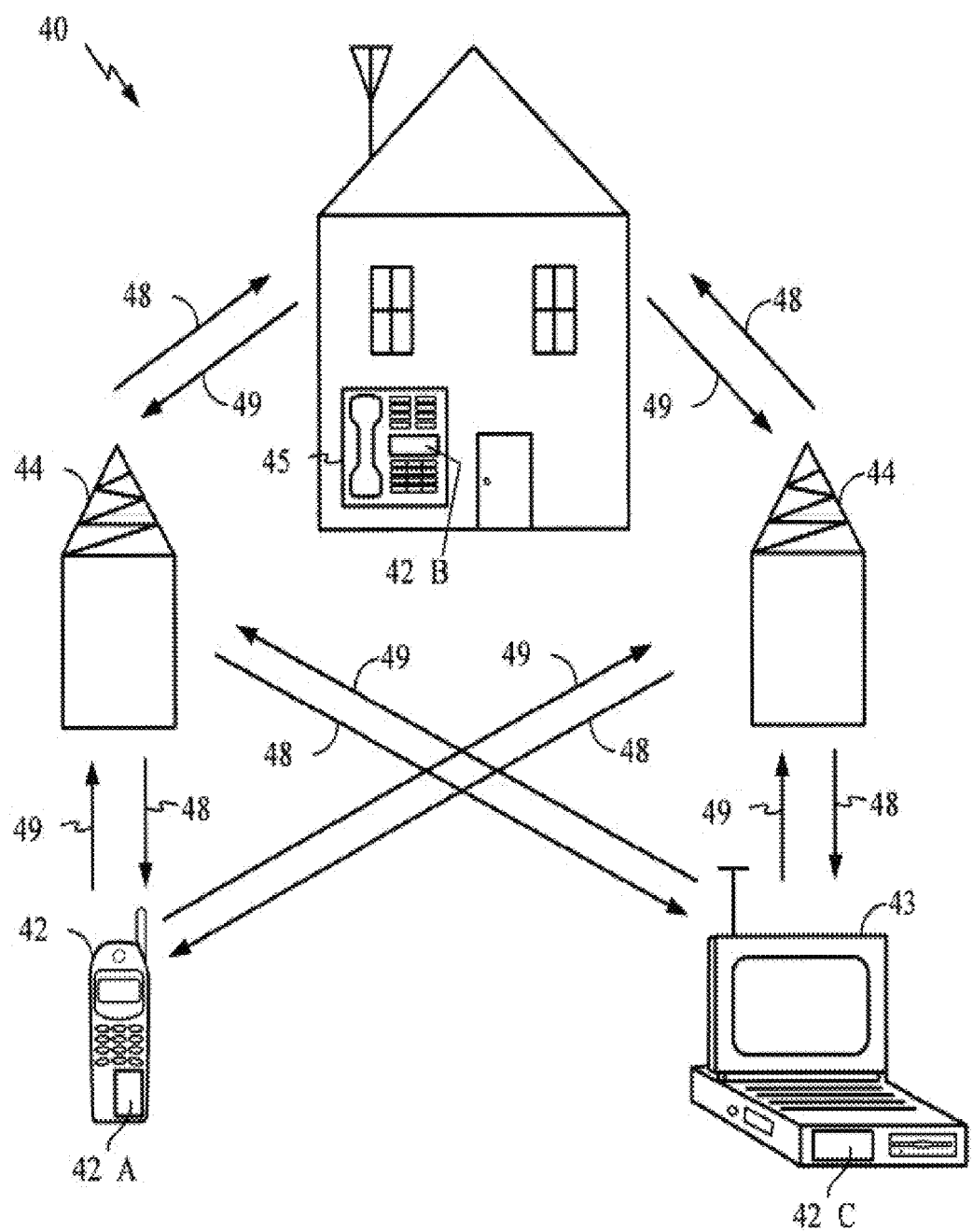
FIG. 3: Block diagram showing an exemplary wireless communication system in which a ferroelectric capacitor of the present invention may be advantageously employed.

FIG. 3 is a block diagram showing an exemplary wireless communication system (40) in which an embodiment of the disclosure may be advantageously employed. For purposes of illustration, FIG. 3 shows three remote units (42), (43), and (45) and two base stations (44). It will be recognized that wireless communication systems may have many more remote units and base stations. Remote units (42), (43), and (45) include circuit devices (42A), (42C) and (42B), which may comprise integrated circuits or printable circuit boards, that include the disclosed ferroelectric capacitor. It will be recognized that any device containing an integrated circuit or printable circuit board may also include the ferroelectric capacitor disclosed here, including the base stations, switching devices, and network equipment. FIG. 3 shows forward link signals (48) from the base station (44) to the remote units (42), (43), and (45) and reverse link signals (49) from the remote units (42), (43), and (45) to base stations (44).

In FIG. 3, remote unit (42) is shown as a mobile telephone, remote unit (43) is shown as a portable computer, and remote unit (45) is shown as a fixed location remote unit in a wireless local loop system. For example, the remote units may be mobile phones, hand-held personal communication systems (PCS) units, portable data units such as personal data assistants, GPS enabled devices, navigation devices, set upper boxes, music players, video players, entertainment units, fixed location data units such as meter reading equipment, or any other device that stores or retrieves data or computer instructions, or any combination thereof. Although FIG. 3 illustrates remote units according to the teachings of the disclosure, the disclosure is not limited to these exemplary illustrated units. Embodiments of the disclosure may be suitably employed in any device which includes the ferroelectric capacitor (1).

Although the present disclosure and its advantages have been described in detail, it should be understood that various changes, substitutions and alterations can be made herein without departing from the technology of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

EXAMPLES

The present invention will be described in greater detail by way of specific examples. The following examples are offered for illustrative purposes only, and are not intended to limit the invention in any manner. Those of skill in the art will readily recognize a variety of noncritical parameters which can be changed or modified to yield essentially the same results.

For each example, a ferroelectric capacitor was fabricated on silicon substrates by sandwiching a blend film of a ferroelectric polymer [P(VDF-TrFE)] obtained from Piezotech S.A., France) and a polyphenylene ether polymer (Noryl™ SA90 Resin from SABIC Innovative Plastics Holding BV (Pittsfield, Mass., USA, was used in the Examples) between a first conducting electrode coated with Pt and a second conducting electrode made of Au. A 2 wt % pure solution of P(VDF-TrFE) was prepared by dissolving 20 mg/mL of the P(VDF-TrFE) copolymer in methyl-ethyl-ketone (MEK) solvent. Blend solutions of P(VDF-TrFE) and the polyphenylene ether were made by adding different amounts of the polyphenylene ether to the P(VDF-TrFE) solution. The polyphenylene ether was solubilized in each prepared solution. The amount varied from 4 mg to 17.39 mg to vary the concentration of the polyphenylene ether from 2 wt % to 8 wt %.

Example 1

Figure 4:
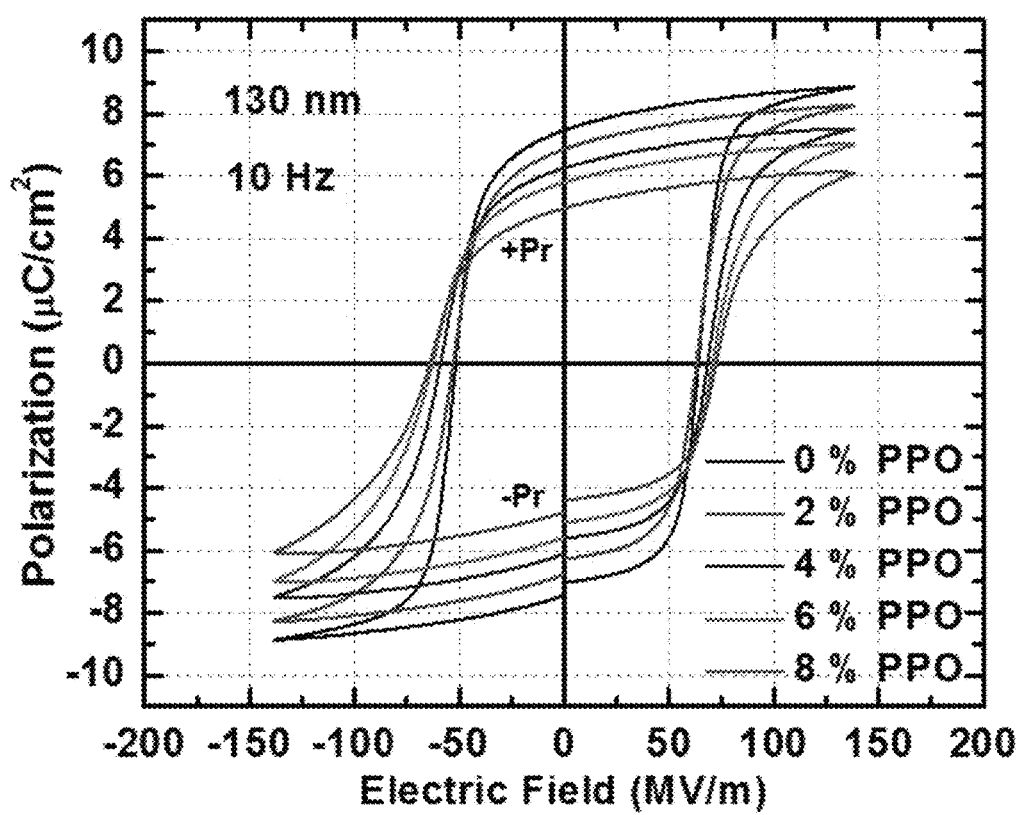
FIG. 4: Chart showing hysteresis of a ferroelectric capacitor of the present invention (polarization over electric field).

Hysteresis (Polarization Versus Electric Field) of Non-Volatile Ferroelectric Memory Capacitors Using Blend Thin Films of Ferroelectric Polymer P(VDF-TrFE) and Polyphenylene Ether The concentration of the polyphenylene ether for the ferroelectric capacitors was varied from 0 to 8 wt %. With increasing wt % of the polyphenylene ether the polarization steadily decreases and the coercive field increases but still shows a typical hysteresis loop (see FIG. 4). Even with concentrations up to 8 wt % polyphenylene ether, there are two distinguishable polarization states (+Pr and −Pr) needed for memory applications. The thin films were spun from the solution by spin coating at 4000 rpm for 60 seconds. The films were then annealed on a hotplate for 30 minutes at 80° C. prior to annealing in a vacuum furnace at 135° C. for 4 hours to improve the crystallinity. Finally, the upper gold electrode was thermally evaporated through a shadow mask.

Example 2

Figure 5:
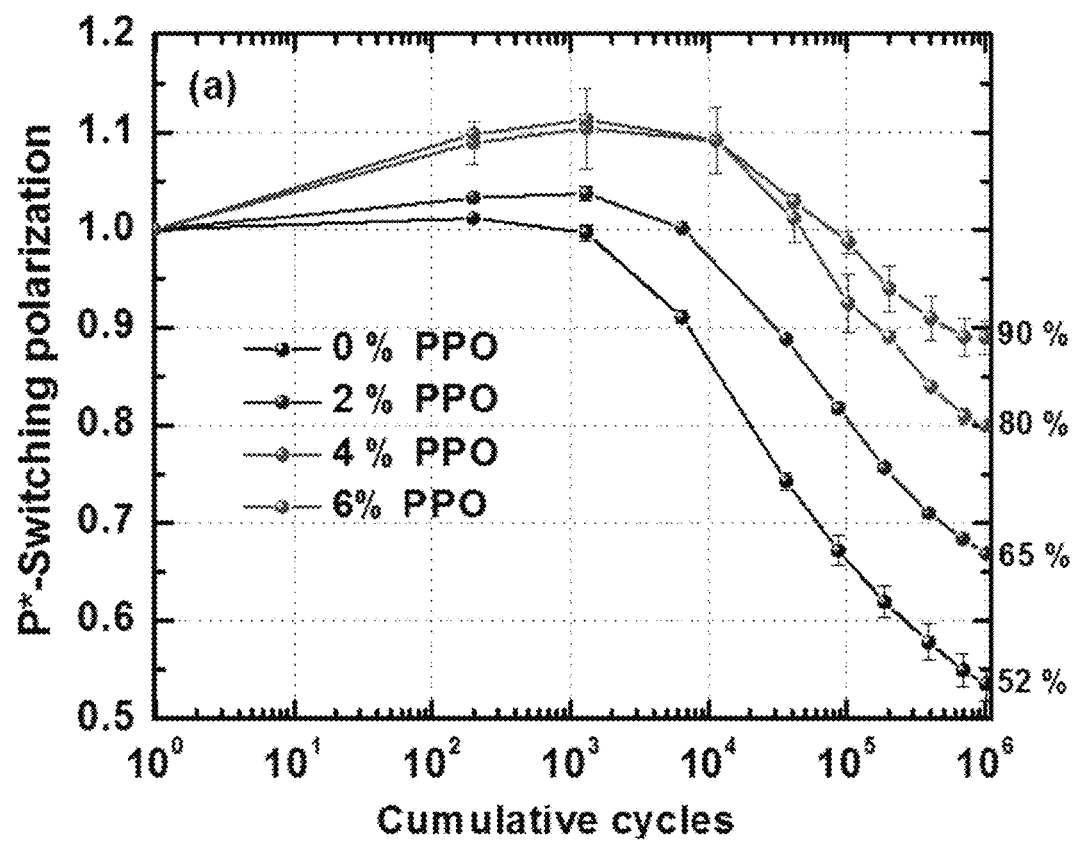
FIG. 5: Chart showing fatigue characteristics of a ferroelectric capacitor of the present invention (p* switching polarization over cumulative cycles).

Fatigue Characteristics of Blend Films with 0 to 6 Wt % Polyphenylene Ether Content The fatigue test was carried out at 100 Hz with an applied field of 100 MV/m. The plot shows the total switching polarization (P*) versus cumulative cycles for the ferroelectric capacitor. With increasing polyphenylene ether content the fatigue improves. Pure P(VDF-TrFE) ferroelectric capacitors show 52% retention of polarization after $10^6$ cycles but it improves up to 90% upon using 6% polyphenylene ether (see FIG. 5).

Example 3

Figure 6:
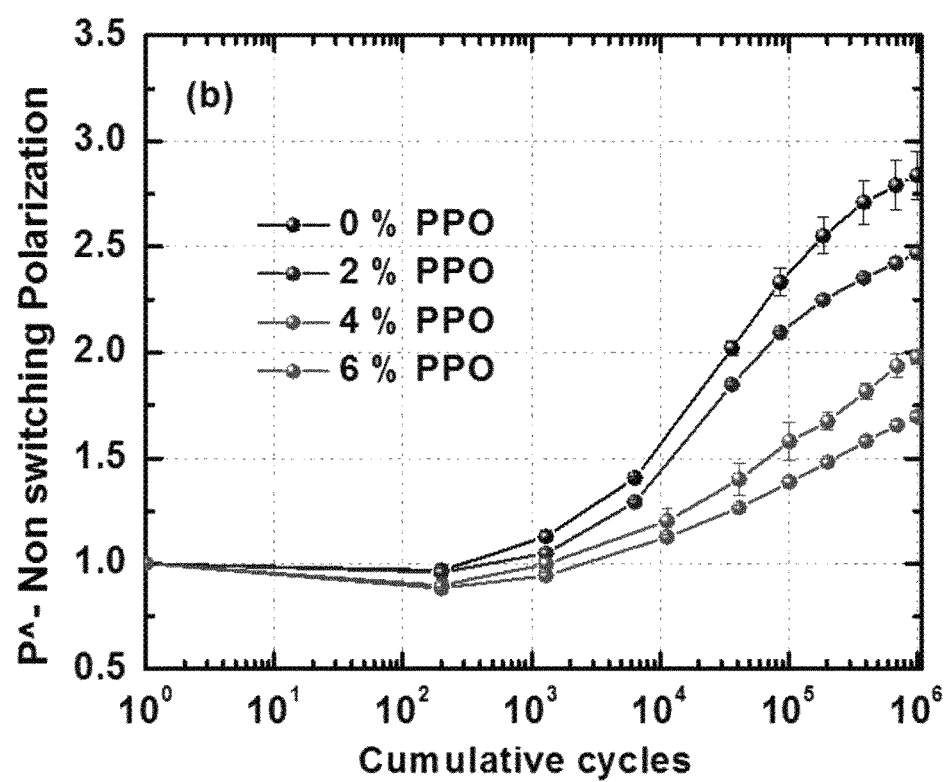
FIG. 6: Chart showing fatigue characteristics of a ferroelectric capacitor of the present invention (p^ non-switching polarization over cumulative cycles).

Fatigue Characteristics of Blend Films with 0 to 6 Wt % Polyphenylene Ether Content The fatigue test was carried out at 100 Hz with an applied field of 100 MV/m. The plot shows the total non-switching polarization (PA) versus cumulative cycles (see FIG. 6). The increase in non-switching polarization with number of cycles is due to injection of charges from electrodes which are subsequently trapped at crystallite boundaries and defects, inhibiting ferroelectric switching. Upon adding polyphenylene ether, the devices show lower rise in this non-switching polarization with number of cycles. Thus this leads to the better fatigue performance of our blend films.

Example 4

Fatigue Characteristics of Blend Films with Polyphenylene Ether

Figure 7:
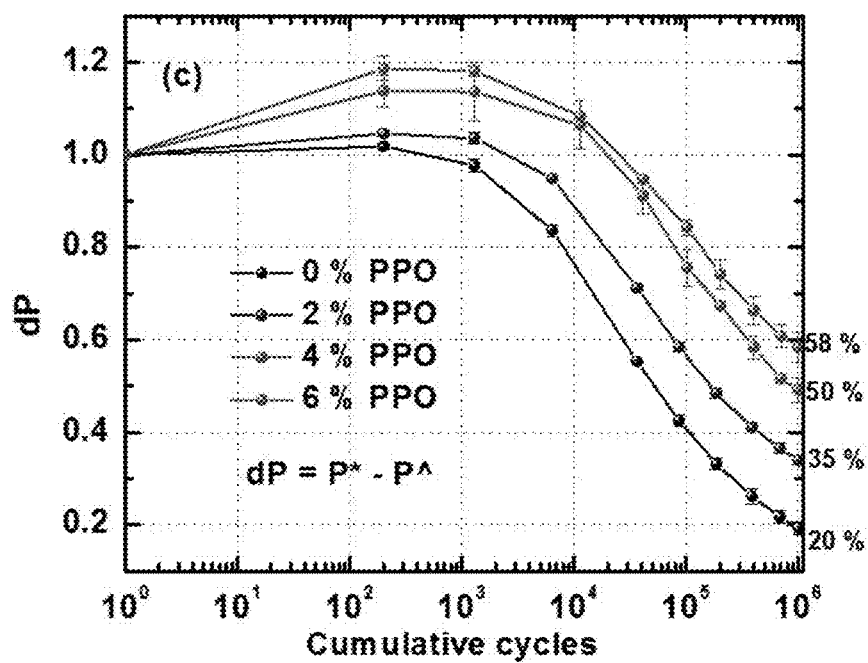
FIG. 7: Chart showing fatigue characteristics of a ferroelectric capacitor of the present invention (dP over cumulative cycles).

A fatigue test was carried out at 100 Hz with an applied field of 100 MV/m for blend films of P(VDF-TrFE) and polyphenylene ether, in which the amounts of polyphenylene ether varied from 0% to 6% (see FIG. 7). FIG. 7 shows the relative remnant polarization (dP=P*−P^) versus cumulative cycles. With increasing polyphenylene ether content the fatigue improves considerably. Pure P(VDF-TrFE) ferroelectric capacitors show only 20% retention of polarization after $10^6$ cycles but it improves up to 58% upon using 6% polyphenylene ether.

Figure 8:
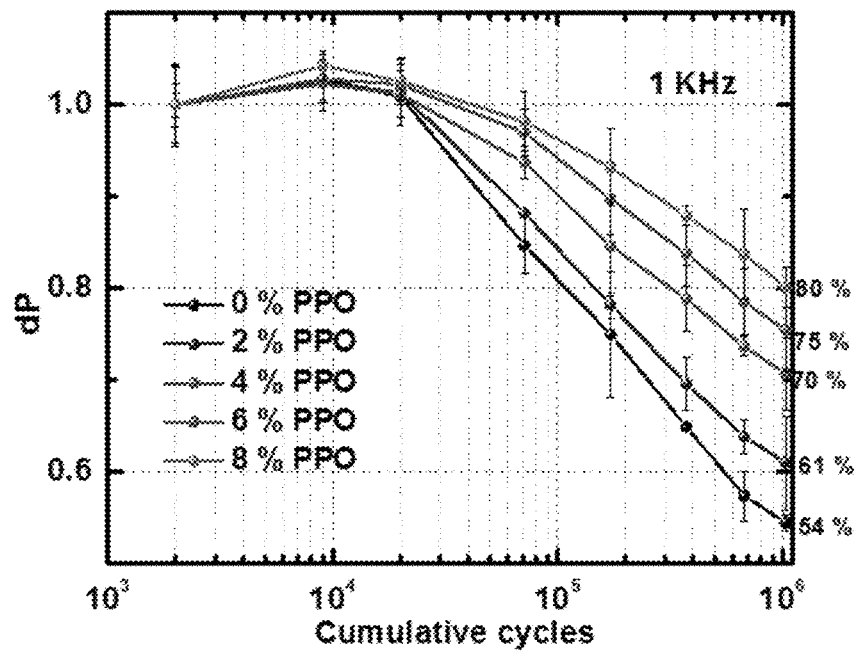
FIG. 8: Chart showing fatigue characteristics of a ferroelectric capacitor of the present invention (dP over cumulative cycles).

Another fatigue test was carried out at 1 kHz with an applied field of 100 MV/m for blend films of P(VDF-TrFE) and polyphenylene ether, in which the amounts of polyphenylene ether varied from 0% to 8% (see FIG. 8). PUND measurements were performed at saturation fields of 125 MV/m and 100 Hz. FIG. 8 shows the relative remnant polarization (dP=P*−P^) versus cumulative cycles. With increasing polyphenylene ether content the fatigue improves considerably. Pure P(VDF-TrFE) ferroelectric capacitors show only 54% retention of polarization after $10^6$ cycles but it improves up to 80% upon using 8% polyphenylene ether.

Example 5

Dielectric Breakdown Field with Polyphenylene Ether Loading Wt %

Figure 9:
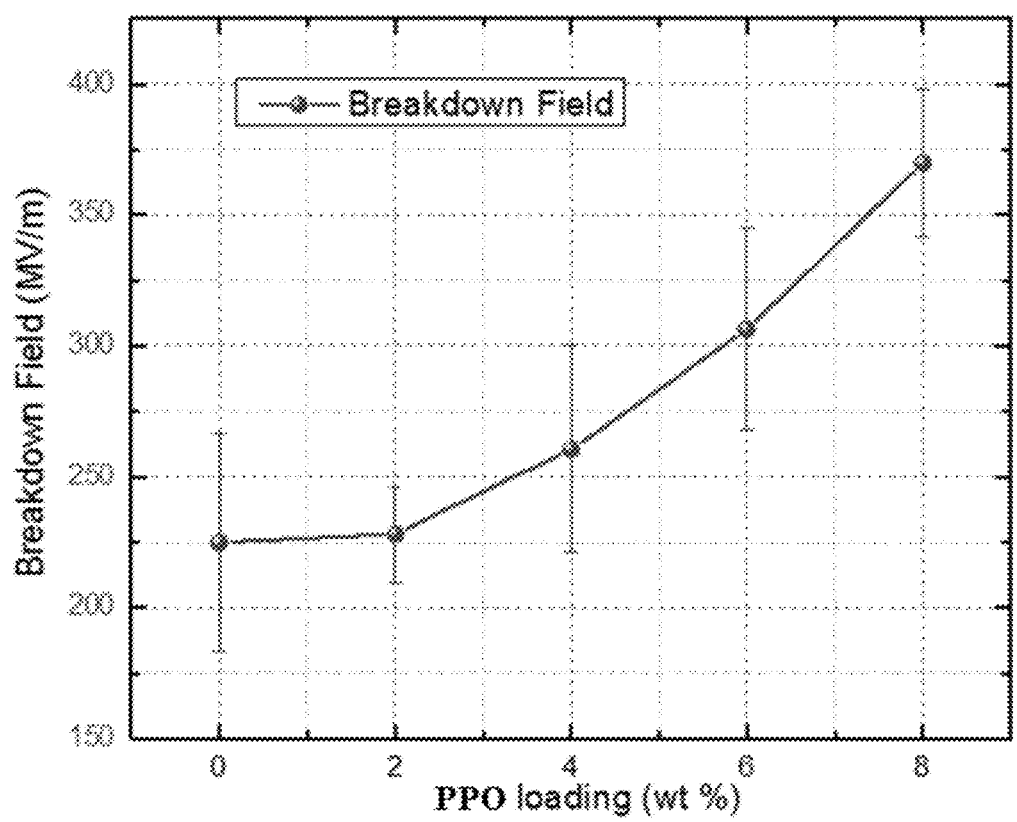
FIG. 9: Chart showing breakdown characteristics of a ferroelectric capacitor of the present invention (breakdown field over resin loading).

Capacitors under different polyphenylene ether loadings were all of equivalent thicknesses. An initial DC pulse (20 V) was applied to pole all devices before breakdown measurement. DC bias was applied at a ramp rate of 3 V/s until device failure. Plotted data points show average breakdown field for 10 devices/sample including error bars. As the plotted data points show, as polyphenylene ether loading wt % increased, the electric breakdown field also increases (see FIG. 9).

Example 6

Thermal Stability of P(VDF-TrFE)-Polyphenylene Ether Blends

Figure 10:
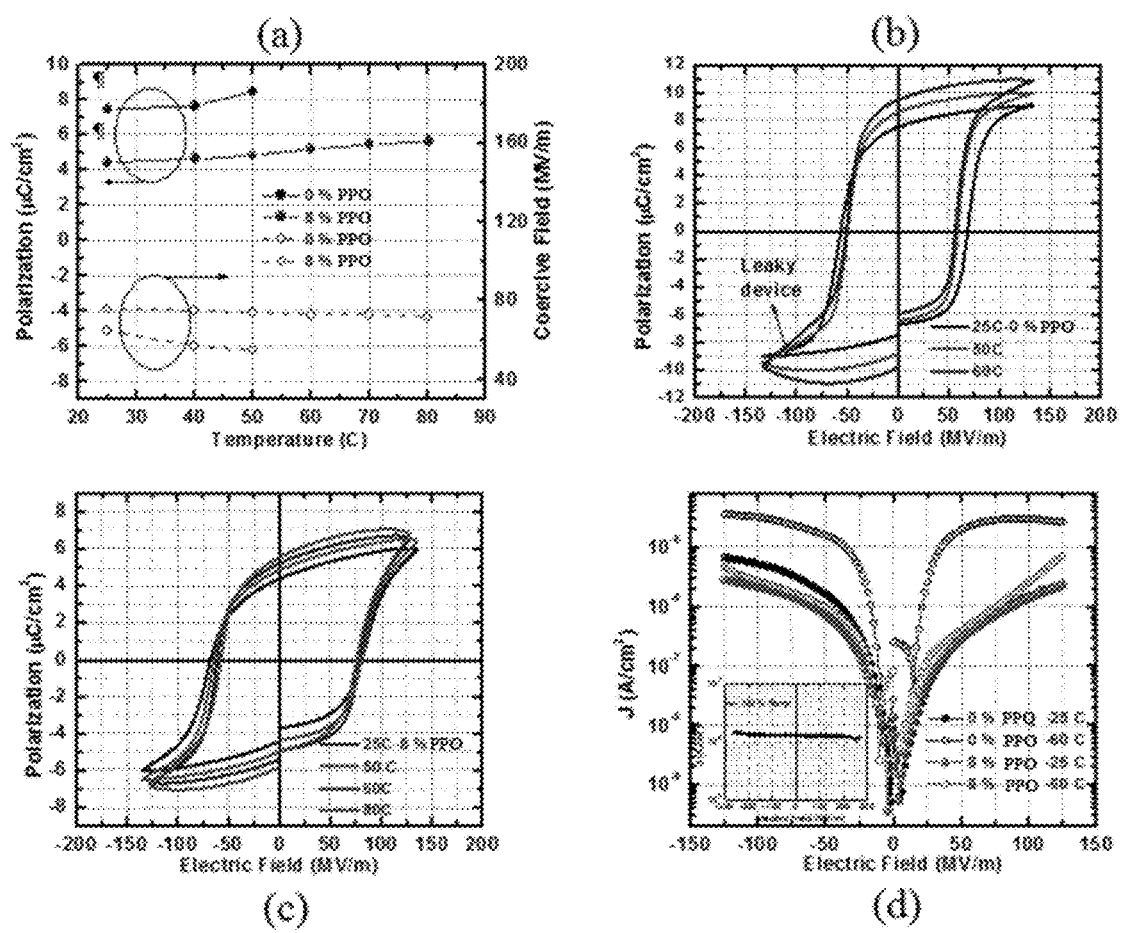
FIGS. 10(*a*)-(*d*): Charts showing thermal stability capabilities of a ferroelectric capacitor of the present invention FIGS. 11(*a*)-(*c*): (a) Schematic 3-D cross section of ferroelectric capacitors with phase separated blends of P(VDF-TrFE)-PPO sandwiched between Pt and Au electrodes. The morphology includes phase separated nanospheres of amorphous PPO, surrounded by P(VDF-TrFE) matrix. (b) Solutions with 0 wt %, 2 wt %, 4 wt %, 6 wt % and 8 wt % PPO (Left to Right) showing clear, homogenous and stable solutions. (c) Solution with 25 wt % PPO showing clear, homogenous and stable solution.

A study was conducted to determine the thermal stability of pure P(VDF-TrFE) (70/30 mol %) and blends of P(VDF- TrFE) (70/30 mol %) and 8 wt % polyphenylene ether content in a capacitor. The devices were studied for the ability to switch polarization at an applied field of 125 MV/m and frequency of 10 Hz. FIG. 10(a) shows the remnant polarization and coercive field as a function of temperature. In general it shows a slight increase in polarization and decrease in coercive field with increasing temperature. The pure P(VDF-TrFE) capacitors showed very poor thermal stability when compared with the blend capacitors. FIG. 10(b) shows that pure P(VDF-TrFE) at temperatures of 60° C. or above, the hysteresis loops displayed a resistive leaky behavior making it impossible to accurately determine polarization in these films. At higher temperatures leaky curves were observed especially in the negative bias regime, indicative of surface breakdown at one of the electrode/ferroelectric interfaces.

By comparison, the blend of P(VDF-TrFE) (70/30 mol %) and 8 wt % polyphenylene ether showed much better thermal stability compared to pure P(VDF-TrFE) capacitors (FIG. 10(a)). The polarization increased as a function of temperature while the coercive field decreases upto 80° C. (FIG. 10(c)). At higher temperatures above 80° C. which are very closely to Curie temperature of the copolymer the polarization drops sharply to ~0, well known for thin film ferroelectric capacitors. To further understand this, a study was performed on the leakage current of pure P(VDF-TrFE) films and blend films as a function of temperature. Leakage of ferroelectric capacitors based on the copolymer has been well studied and shows a relatively high leakage for thin films around 100 nm. The introduction of TrFE is very effective in obtaining the ferroelectric β phase in the copolymer but also leads to larger leakage current. If an electric field to switch polarization is applied, current leakage occurs easily at the TrFE monomer because two fluorine atoms opposite from the carbon atoms of the TrFE monomer cause a current leak path. This is evident for thin films P(VDF-TrFE) capacitors with high TrFE content and several studies have reported large leakage issues. FIG. 10(d) shows that at saturation fields of ~125 MV/m pure P(VDF-TrFE) capacitors show leakage current density of in excess of $10^{-6}$ A/cm$^2$ at room temperature. On the other hand pure polyphenylene ether films display low leakage current of ~$10^{-8}$ A/cm$^2$ even at high fields ~300 MV/m further highlighting the excellent insulating properties of PPO. The blend devices with 8 wt % polyphenylene ether show similar leakage currents with slightly lower currents on the negative bias. Without wishing to be bound by theory, it is believed that this is due to the current conduction through the more leaky majority ferroelectric phase. Notably, a drastic improvement in leakage current of the blend films compared to pristine P(VDF-TrFE) films at higher temperatures of 60° C. was observed. This leakage current density of the blend films does not change much with temperature and is an order of magnitude lower than P(VDF-TrFE) films at 60° C. This is likely due to the highly insulating amorphous nanospheres of polyphenylene ether in the blend films acts as good charge trap regions and do not allow charge carriers to move freely through the film. This directly affects thermal stability of these blend films, thus leading to reliably switching the polarization even at elevated temperatures close to the Curie temperature.

Example 7

Additional Data of Prepared Films and Devices

High performance polymer memory films were fabricated using blends of ferroelectric poly(vinylidene-fluoride-trifluoroethylene) (P(VDF-TrFE)) and highly insulating Poly (p-phenylene Oxide) (PPO). The blend films spontaneously phase separate into amorphous PPO nanospheres embedded in a semicrystalline P(VDF-TrFE) matrix. Using low molecular weight PPO with high miscibility in a common solvent (i.e., Methyl Ethyl Ketone), spin cast blended films with low roughness ($R_{rms}$~4.92 nm) and nano-scale phase separation (PPO domain size <200 nm) were produced. These blend devices display highly improved ferroelectric and dielectric performance with low dielectric losses (<0.2 up to 1 MHz), enhanced thermal stability (~upto 353 K), excellent fatigue endurance (80% retention after $10^6$ cycles at 1 KHz) and high dielectric breakdown fields (~360 MV/m).

A. Materials and Methods

Sample Preparation:

The polymer blend thin films were fabricated on Platinum coated silicon substrates. Prior to device fabrication, the substrates were cleaned by ultra-sonication in Acetone, Isopropanol and DI water respectively. P(VDF-TrFE) (70/30 mol. %) obtained from Piezotech S.A, France was dissolved in anhydrous Methyl Ethyl Ketone (MEK) at a concentration of 20 mg/mL to make a 2 wt % solution. High purity low molecular weight Polyphenylene Oxide (Noryl SA90 PPO) ($M_n$~1800) obtained from Saudi Basic Industries Corporation (SABIC) was dissolved in 10 mL P(VDF-TrFE) solutions by varying the amounts (4.08 mg, 8.22 mg, 12.76 mg, 17.39 mg, 27.27 mg) to make 2 wt % to 8 wt % P(VDF-TrFE)-PPO blend solutions. All the different concentrations of PPO formed clear homogenous solutions stable even after a few weeks. The filtered polymer blend films were spun in a nitrogen filled glove box, at 4000 rpm for 60 seconds followed by a soft bake for 20 min at 70° C. The films were then annealed in vacuum at 135° C. for 4 hours to improve the crystallinity of the P(VDF-TrFE) phase. The thickness of the blend films was ~120±10 nm as measured by a Dektak profilometer, and did not change much with increasing PPO concentrations. To complete the device, ~80 nm Gold (Au) was thermally evaporated through a shadow mask to define the top electrodes.

Characterization of Films:

All current-voltage measurements were carried out in air ambient using Keithley 4200 semiconductor characterization system, while Polarization-Voltage and fatigue tests were done using the Premier Precision II ferroelectric tester (Radiant Technologies Inc.). Surface morphology and roughness for the blend films was studied using Atomic Force Microscopy (Agilent 5400). Cross section morphology of the devices was studied using Transmission Electron Microscopy (Titan ST) and operated at an accelerating voltage of 300 kV. Energy Filtered TEM analysis was done to elementally map carbon in the polymer blend films. The crystallinity and inter-planar spacing of polymer chains was evaluated using Grazing Incidence X-ray Diffraction (Bruker D8 Discover) while the bonding and dipole orientation was analyzed using Fourier-transform infrared spectroscopy (FT-IR, ThermoScientific Nicolet iS10).

B. Results

1. Morphology

Figure 11:
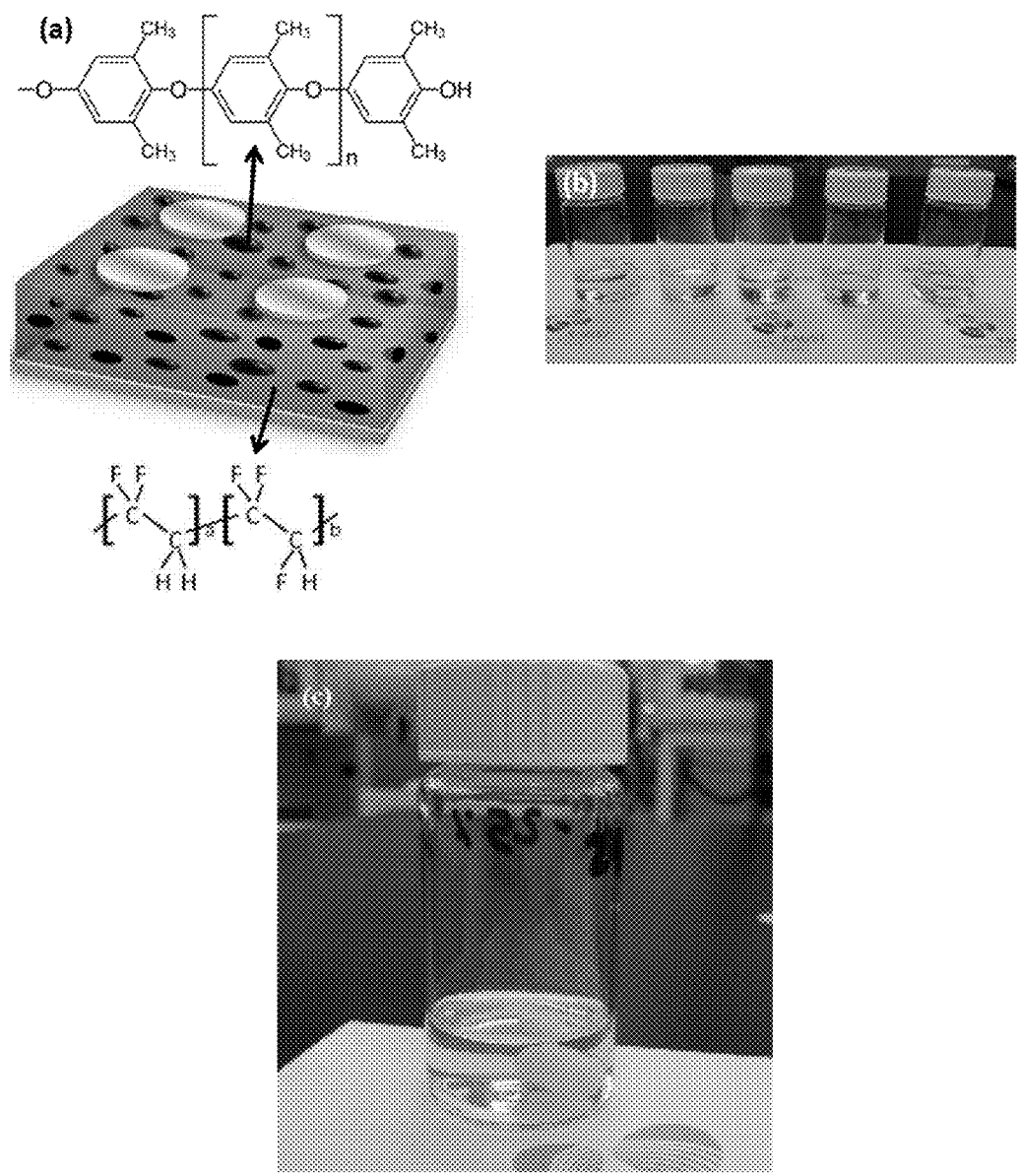

A schematic of the nanoscale phase-separated polymer blend devices is shown in FIG. 11(a). The active single-layer is a blend film spin-cast from a solution of ferroelectric P(VDF-TrFE) and insulating PPO from a common solvent—Methyl Ethyl Ketone. The morphology of the blend films includes a phase separated nanospheres of amorphous PPO, embedded in a semicrystalline, ferroelectric P(VDF-TrFE) matrix. The P(VDF-TrFE)-PPO blends are highly miscible and stable in a large range of compositions from 0 to 25 wt % of PPO content. FIG. 11(b) shows clear homogenous solutions from 2 wt % to 8 wt %. Solutions with up to 25 wt % PPO were made and remained stable up to one month (FIG. 11(c)). FIG. 11(a) also shows the chemical structure of P(VDF-TrFE) and PPO. PPO i.e. Poly(p-phenylene oxide) is an aromatic polyether with oxygen connected to aromatic aryl groups. Ethers are slightly polar in nature as the C—O—C bond angle in the functional group is about 110 degrees, and the C—O dipole does not cancel out. The presence of two lone pairs of electrons on the oxygen atoms makes hydrogen bonding with water and other polar molecules possible. It is believed that hydrogen bonding between the electronegative oxygen in PPO and electropositive hydrogen in P(VDF-TrFE) and the electropositive hydrogen in the methyl group of PPO and electronegative fluorine in P(VDF-TrFE) leads to the miscibility of these blends.

Figure 12:
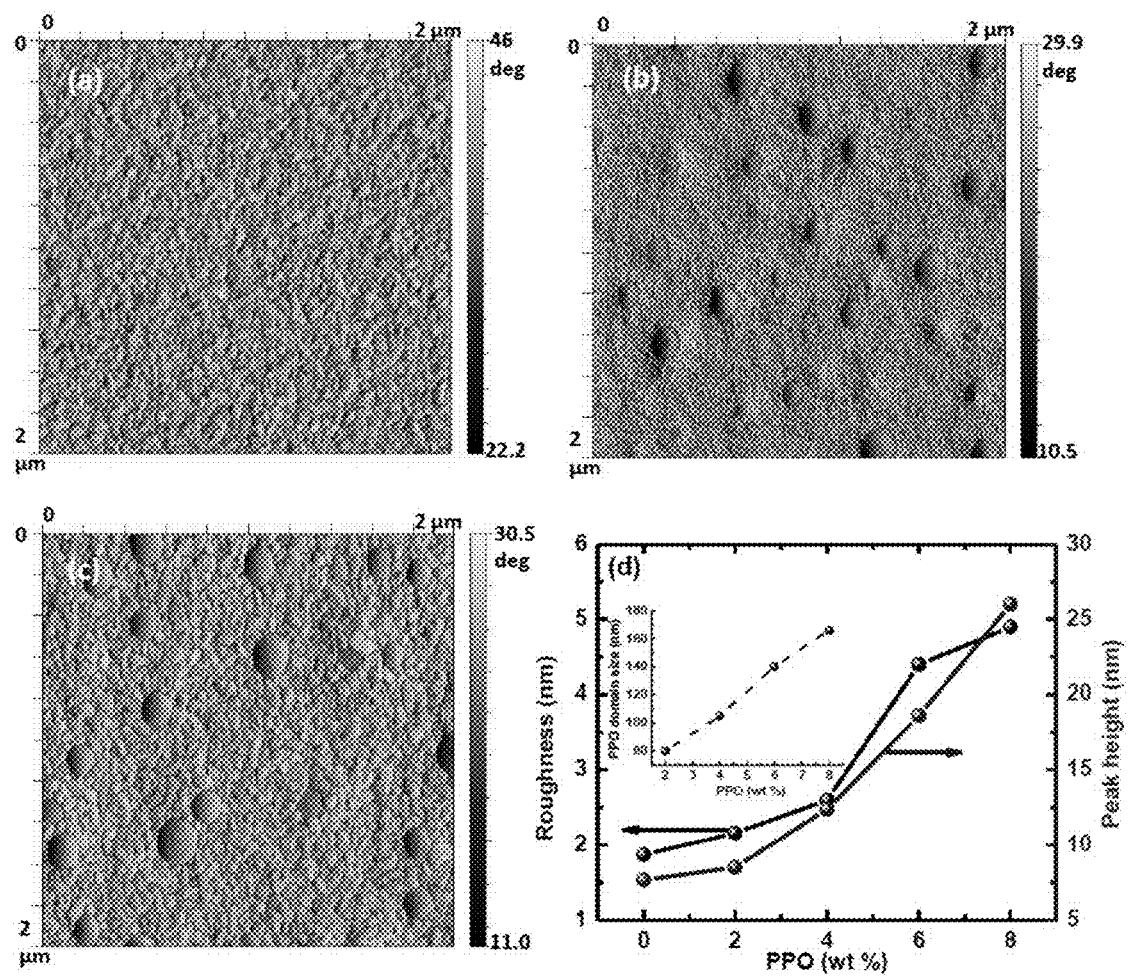
FIGS. 12(*a*)-(*d*): (a) AFM phase image of pure P(VDF-TrFE) film showing island like grains in the film. (b) AFM phase image of as spun blend films with 6 wt % PPO without annealing. (c) AFM phase image of blend films with 6 wt % PPO after annealing at 135° C., with increase in grain size of P(VDF-TrFE). (d) $R_{rms}$ (Left) and peak height (Right) of blend films as a function of PPO loading. The inset shows average size of the PPO nanospheres as calculated from the AFM phase images.
Figure 13:
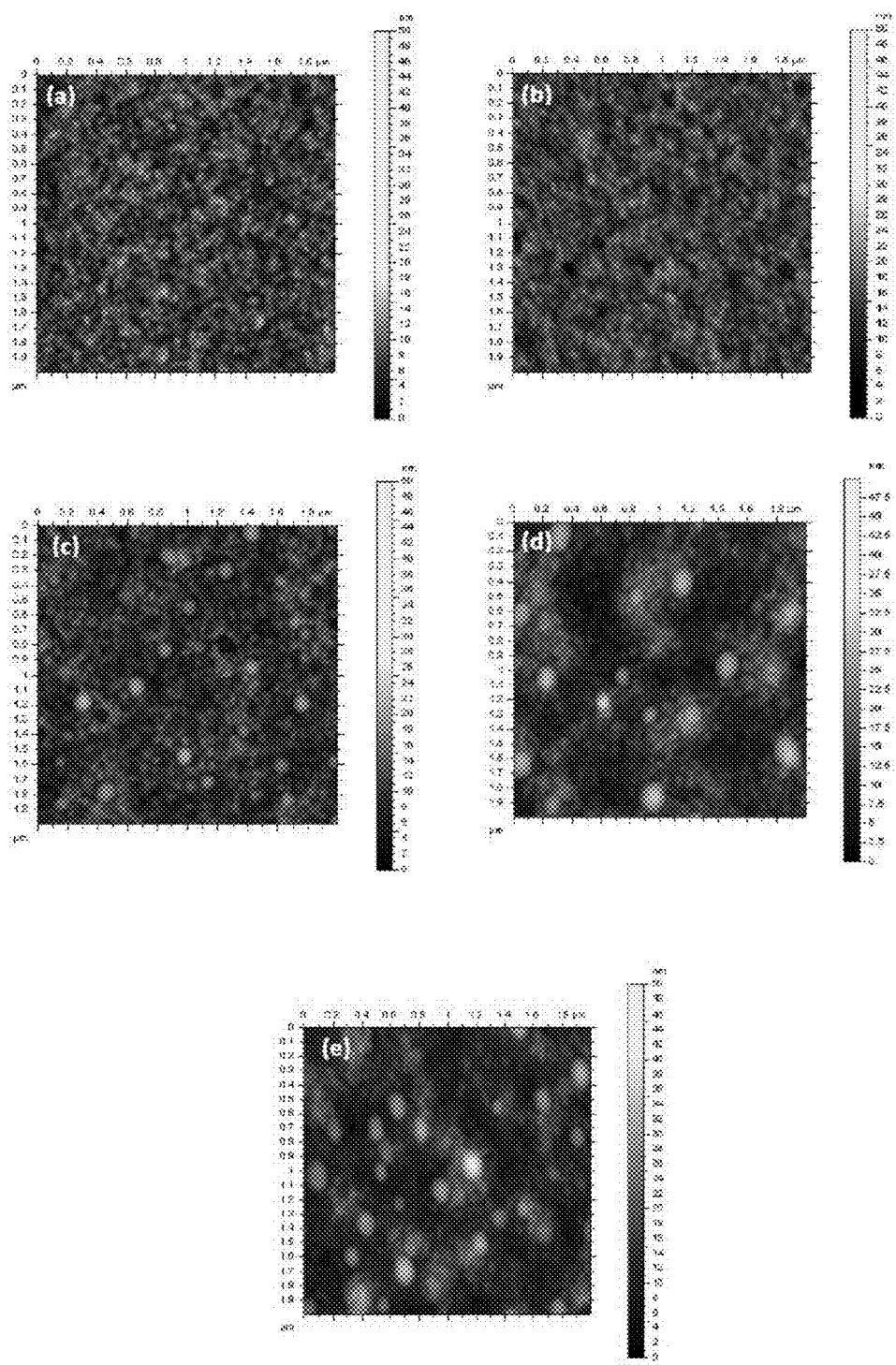
FIGS. 13(*a*)-(*e*): AFM topography images of blend films with 0 wt % (a), 2% (b), 4% (c), 6% (d) and 8 wt % PPO (e).
Figure 14:
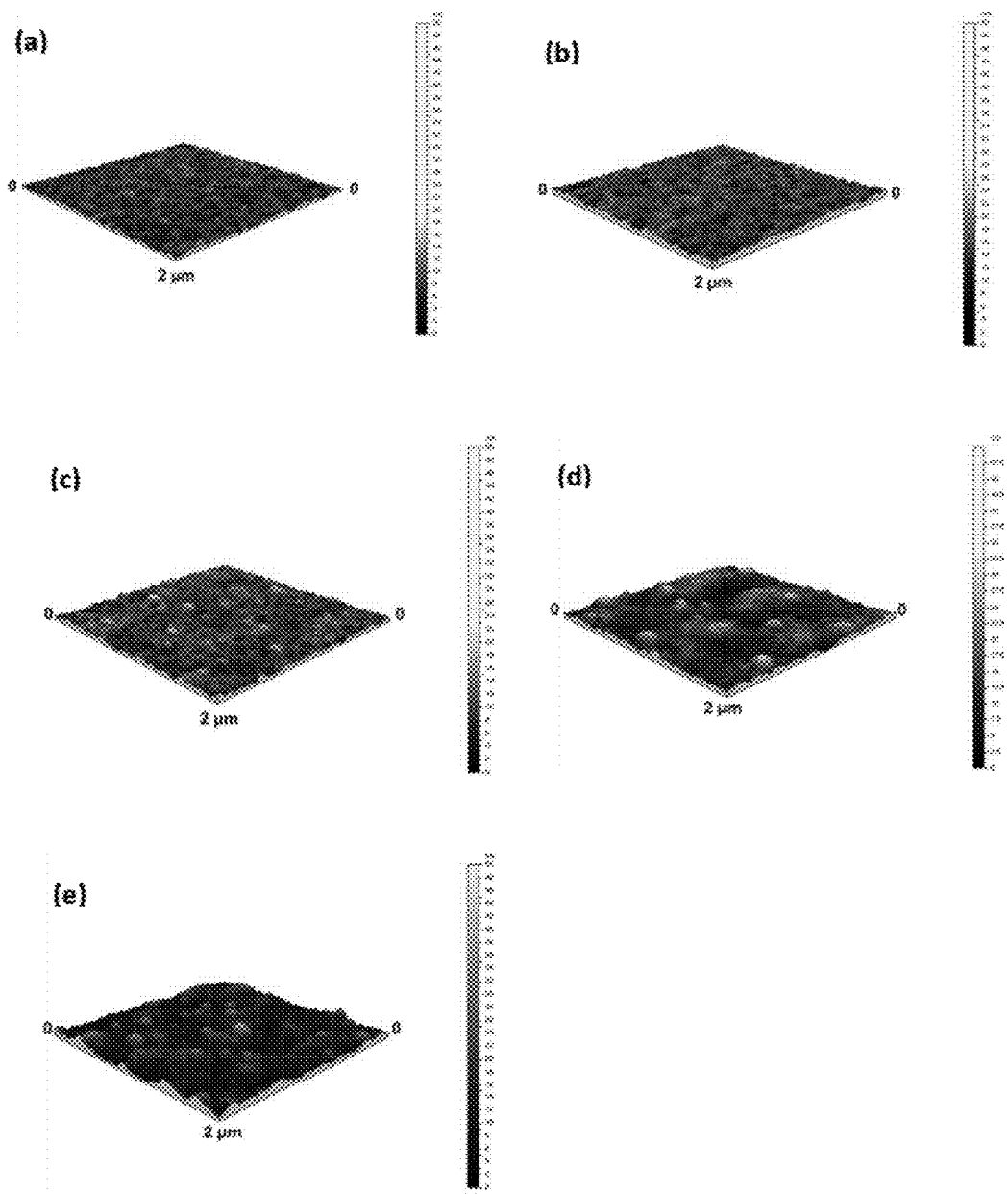
FIGS. 14(*a*)-(*e*): AFM 3-D topography images of blend films with 0 wt % (a), 2% (b), 4% (c), 6% (d) and 8 wt % PPO (e).
Figure 15:
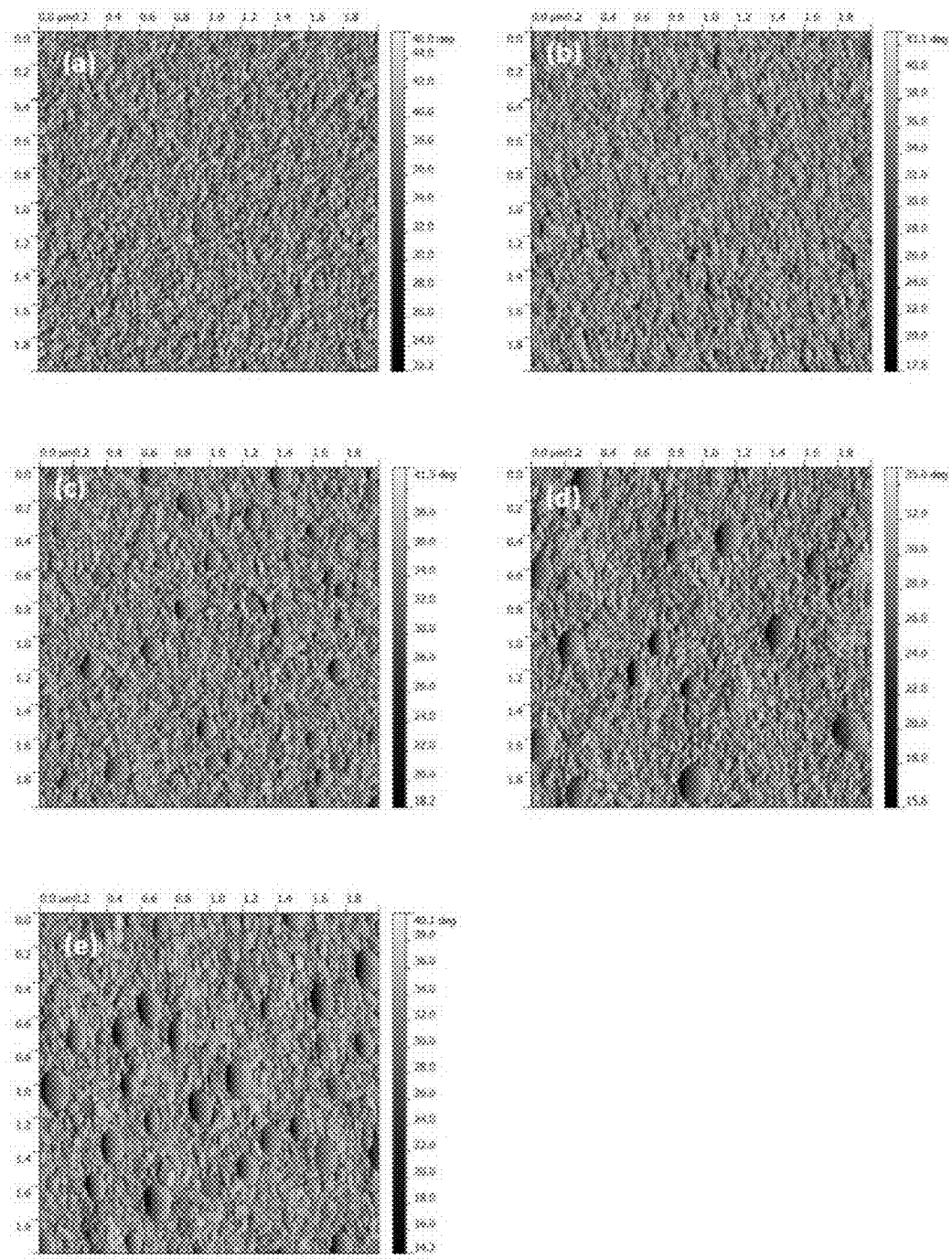
FIGS. 15(*a*)-(*e*): AFM phase images of blend films with 0 wt % (a), 2% (b), 4% (c), 6% (d) and 8 wt % PPO (e).

The surface morphology and phase separation of 120 nm thick polymer blend films spun on Pt/Si substrates was characterized using atomic force microscopy (AFM as shown in FIG. 12. FIG. 12(a) shows the typical morphology of P(VDF-TrFE) thin films with crystalline grains about 80-100 nm in size. FIG. 12(b) shows spun cast blend films with 6 wt % PPO. These films were not subjected to any annealing process. The blends phase separate into amorphous PPO nanospheres (~140 nm in size) randomly distributed throughout the films surrounded by the semi crystalline P(VDF-TrFE) matrix. The AFM study confirmed that phase separation for these blends was spontaneous and not thermally stimulated. FIG. 12(c) shows the phase image of the same blend film after annealing at 135° C. for 4 hours. After annealing, an increase in grain size of the semi crystalline P(VDF-TrFE) was observed, which is indicative of higher crystallinity. However, there was no significant change in the microstructure of PPO nanospheres or the roughness of the blend films. AFM measurements were performed as a function of blending ratio from 0 to 8 wt % PPO content. By increasing the amount of PPO the average lateral size of the PPO nanospheres increased in a linear fashion from ~80 nm in a 2 wt % films, ~105 nm (4 wt %), ~140 nm (6 wt %) and ~165 nm for 8 wt % film as depicted in the inset of FIG. 12(d). This was calculated from the AFM phase images of blend films with different PPO loadings. Furthermore the number of PPO nanospheres decreased with increasing PPO content (see FIGS. 12-15), i.e. the phase separation coarsened with increasing PPO content. These observations appear to rule out that the solidification process is due to nucleation and growth. It is believed that the phase separation is due to spinodal decomposition in which the separation occurs uniformly throughout the film and not at distinct nucleation sites. The surface roughness of ferroelectric thin films can be a key parameter when fabricating ferroelectric memory. High surface roughness leads to non-uniform electrical field across the active layer and possibly poor yield and reproducibility for ferroelectric capacitors and low mobility and low ON/OFF ratios in ferroelectric transistors (see Naber et al., *Adv. Mater.* 2010. 22, 933; Asadi et al. *Adv. Funct. Mater.* 2011, 21, 1887; Khan et al. *Adv. Funct. Mater.* 2012, 23, 2145). The measured surface roughness from the topography images of these blend films show relatively smooth films with an increase in roughness from ~2 nm for pure P(VDF-TrFE) films to ~5 nm for a blend film with 8 wt % PPO. As seen from FIG. 12(d), with increasing amounts of PPO the peak height of the amorphous PPO nanospheres increased hence leading to increased roughness. This can be further optimized and improved using techniques like temperature assisted wire-bar coating which has recently been used to fabricate smooth, polymer blend thin films. (see Li et al. *Macromolecules.* 2012, 45, 7477; Li et al. *Adv. Funct. Mater.* 2012, 22, 2750). FIG. 13, FIG. 14, and FIG. 15 provide additional AFM topography images, AFM 3-D topography images, and AFM phase images, respectively, of blend films with 0, 2, 4, 6, and 8 wt % PPO.

Figure 16:
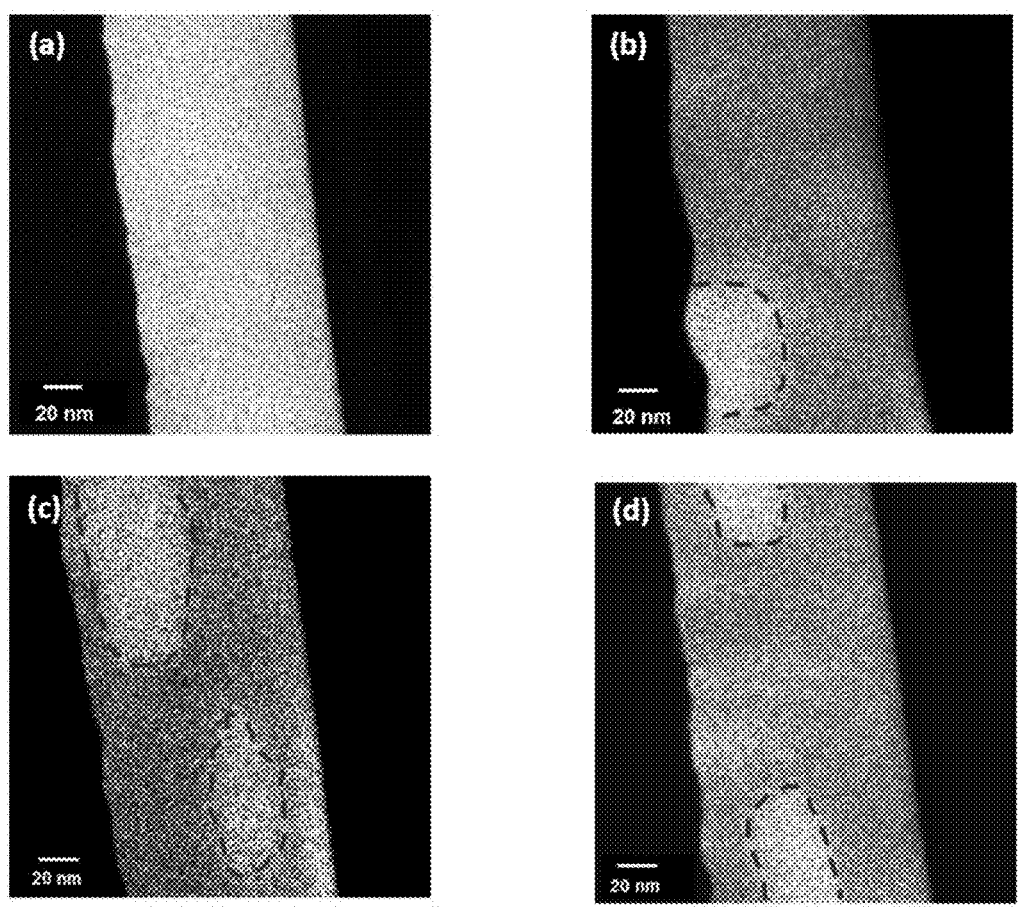
FIGS. 16(*a*)-(*d*): Cross section TEM images of pure P(VDF-TrFE) films (a) and blend films with 6 wt % PPO (b,c,d).

The cross section morphology and phase separation was characterized through transmission electron microscopy (TEM) as seen in FIG. 16. FIG. 16(a) shows the cross section TEM image of a 120 nm thick pure P(VDF-TrFE) thin film. FIGS. 16(b)-(d) show the cross sections of 6 wt % PPO blend film sandwiched between Pt and Au electrodes at different locations. The TEM images confirm the morphology of these blend films consists of phase separated nanospheres of amorphous PPO, surrounded by a ferroelectric P(VDF-TrFE) matrix as seen by AFM. The observed phase separation was seen in multiple locations throughout the film, as shown in FIGS. 16(c) and (d). FIGS. 17(a)-(d) provide energy filtered cross section TEM images of the films with 0 and 6 wt % PPO.

2. Crystal Structure and Orientation

Figure 18:
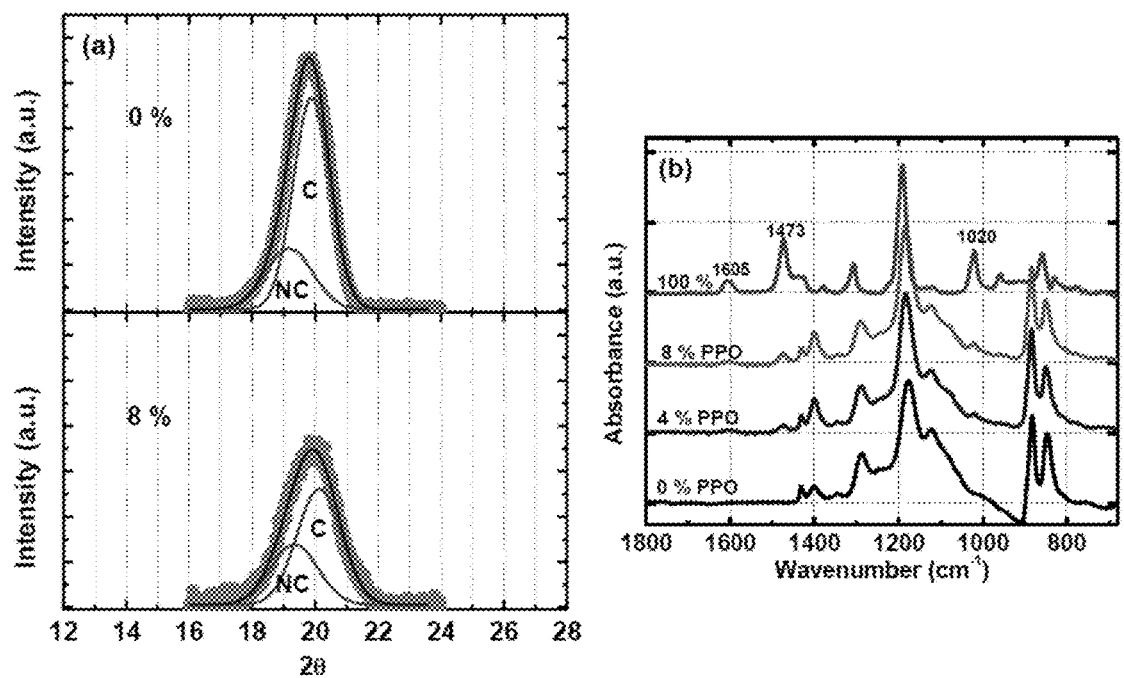
FIGS. 18(*a*)-(*b*): (a) Grazing incidence XRD spectra for pure ferroelectric P(VDF-TrFE) films and blend films with 8 wt % PPO. (b) FT-IR spectra of pure ferroelectric P(VDF-TrFE) thin film, pure PPO thin film and blend films with 4 wt % and 8 wt % PPO.

FIG. 18(a) shows the Grazing Incidence X-ray diffraction (GIXRD) spectra which was used to study the crystal structure of pure ferroelectric P(VDF-TrFE) and the polymer blends with PPO. Pristine P(VDF-TrFE) films spun on Pt electrodes and annealed at 135° C. exhibit a peak centered at $2\theta \sim 19.76°$, characteristic of the ferroelectric β phase and reflection from the (110) and (200) planes (see Park et al., *IEEE. T. DIELECT. EL. IN.* 2010, 17, 1135; Khan et al., *Org. Electron.* 2011, 12, 2225; Tajitsu et al., *Jpn. J. Appl. Phys.* 1987, 26, 554). The inter-planar distance was calculated to be approximately 4.14 Å and is consistent with earlier reports (see Khan et al., *Org. Electron.* 2011, 12, 2225; Bhansali et al., *Org. Electron.* 2012, 13, 1541). The broad peak full-width-half-maxima(FWHM~1.59°) is typical of a semicrystalline polymer like P(VDF-TrFE) comprising of crystalline lamella and amorphous regions. Highly crystalline ferroelectric thin films are advantageous, as only the β-crystalline regions in the films give rise to ferroelectricity because the dipole moments in the amorphous regions will be random and cancel out each other (see Naber et al. *Adv. Mater.* 2010, 22, 933). X-ray diffraction is the primary technique to determine crystallinity of semicrystalline polymers and has been previously used for P(VDF-TrFE) thin films (see Tajitsu et al., *Jpn. J. Appl. Phys.* 1987, 26, 554). The determination of the degree of crystallinity implies use of a two-phase model, i.e. the sample is composed of crystals and amorphous regions and no regions of semi-crystalline organization. The diffraction peak observed could be well resolved into two peaks, C (Crystalline) and NC (Non crystalline). A gaussian function was used to obtain the best fitting. The degree of crystallinity can be calculated from the ratio of area under C to total area under C+N. The calculated degree of crystallinity for pure P(VDF-TrFE) was ~74%, typical of very thin (~100-200 nm) P(VDF-TrFE) films (see Zeng et al., *Chinese. J. Polym. Sci.* 2009, 27, 479-485).

FIG. 18(b) shows the XRD peak for blend films with 8% PPO content. The blend films with PPO exhibit a peak slightly shifted to the right at $2\theta \sim 20°$ for 8 wt % PPO films, indicating a smaller polymer chain inter-planar distance of ~4.08 Å°. The polymer blend films phase separate and thus it is possible that with increasing PPO content there is more stress on the P(VDF-TrFE) phase leading to closer chain packing or smaller interplanar distance. Furthermore, the XRD peaks indicate that the polymer blend films have smaller crystallite size compared to the pristine P(VDF-TrFE) films with a larger FWHM~2°. Lower crystallinity for blend films with increasing PPO content was observed, and was approx ~62% for 8 wt % PPO films.

The presence of PPO in thin films of the polymer blend was verified using transmission mode Fourier Transform Infra-Red (FTIR) spectroscopy. FIG. 18(b) shows the absorbance bands at 1288 cm$^{-1}$ and 850 cm$^{-1}$ associated with $CF_2$ symmetric stretching vibration and are characteristic bands of the trans-zigzag formation (β phase) (see Khan et al., *Org. Electron.* 2011, 12, 2225; Prabu et al., *Vib. Spectrosc.* 2009, 49, 101; Reynolds et al., *Macromolecules.* 1989, 22 1092). Other major peaks identified are the 1400 cm$^{-1}$ band characteristic of the $CH_2$ wagging vibrations, 1186 cm$^{-1}$ band characteristic of asymmetric stretching of $CF_2$ and the 880 cm$^{-1}$ band related to the rocking $CH_2$ vibration (see Khan et al. 1989). All these peaks were common in both pristine P(VDF-TrFE) and P(VDF-TrFE)-PPO blended films. A few additional peaks were identified in the blend films at 1605 cm$^{-1}$ characteristic of C—C=C symmetric stretching in the benzene ring, 1473 cm$^{-1}$ from C—C=C asymmetric stretching and 1020 cm$^{-1}$ from C—O stretching confirming the preseence of ether group in PPO (S. B. Gajbhiye, *IJMER.* 2012, 2, 941; Kim et al., *Nanotechnology.* 2005, 16, S382; Shimizu et al., *Biosci. Biotechnol. Biochem.* 2001, 65, 990). Notably, the methyl functional groups were not deted in the FTIR spectra which might be due to some overlapping with other peaks or due to the poor resolution of the FTIR equipment. FTIR analysis confirms the presence of PPO in these polymer blend films but does not suggest any interaction or bonding between the PPO and P(VDF-TrFE) chains.

3. Ferroelectric and Dielectric Performance of Blend Films

FIG. 19(a) shows the polarization-electric field hysteresis loops for P(VDF-TrFE)-PPO blend devices. The devices measured at 10 Hz exhibit well-saturated hysteresis curves and pure P(VDF-TrFE) capacitors show a remnant polarization (±$P_r$) of 7.3 μC/cm$^2$ and coercive field of ~62±5 MV/m. With increasing PPO content, a monotonic decrease in remnant polarization and increase in coercive fields is observed. Blend films with 8 wt % PPO exhibit a remnant polarization (±$P_r$) of 4.93 μC/cm$^2$ and coercive field of ~67±5 MV/m. This effect can be attributed to the decrease in crystallinity of the films upon adding PPO, as seen from the x-ray diffraction peaks in FIG. 18(a).

In ferroelectric capacitors, the difference between switching and non-switching current should be maximized to be able to distinguish the "0" from "1" memory state. FIG. 19(b) shows that with increasing PPO content the switching current gradually decreases. But even with high amounts of PPO content up to 8 wt %, the blend capacitors display good switching current density ~15 μA/cm$^2$; comparable to reports of pure P(VDF-TrFE) based ferroelectric capacitors (see Lee et al., *Appl. Phys. Lett.* 2009, 94, 093304; Noh et al., *Appl. Phys. Lett.* 2007, 90, 253504). At the same time the switching time characteristics of the P(VDF-TrFE)-PPO blend films were measured, which can be obtained by a time domain measurement of the charge density or polarization (P) response. Switching times ($\tau_s$) are estimated from the time of the maximum of dP/d(log t) vs. log (t) plot and are plotted in the inset of FIG. 15(b) (see Furukawa et al., *IEEE. T. DIELECT. EL. IN.* 2006, 13, 1120). At applied fields of 125 MV/m, pure P(VDF-TrFE) capacitors devices exhibit switching times of 0.19 ms while devices with 8 wt % PPO have similar switching times of ~0.21 ms. Thus switching times do not vary significantly with increase in PPO content, another important aspect for ferroelectric memories.

An advantage of using PVDF-based ferroelectric polymers is their high capacitance or high permittivity coming from their ability to polarize under an applied electric field. This makes it possible to fabricate devices with low operating voltages using them as a dielectric layer. A gate dielectric with high permittivity reduces the operating voltage of OTFTs effectively without the need for thickness reduction (see Jung et al., *J. Appl. Phys.* 2010, 108, 102810). Thus, it is important to characterize the effect of PPO on dielectric dispersion of these blend films. FIG. 19(c) shows the dielectric dispersion and the loss factor (tan δ) of pure P(VDF-TrFE), pure PPO and blend ferroelectric capacitors. The P(VDF-TrFE) copolymer films exhibit a dielectric constant of ~11 at 100 Hz, comparable to other reports in literature (see Khan et al., *Appl. Phys. Lett.* 2012, 101, 143303). A gradual decay of the dielectric permittivity ($E_r$) is observed for pure P(VDF-TrFE) capacitors, consistent with the dielectric response of a polar polymer dielectric where the dipoles cannot respond to the applied field at high frequencies. On the other hand PPO exhibits a dielectric constant of ~3 and a dielectric response which is independent of frequency, typical of low dielectric constant polymer dielectrics. In such materials the electronic polarization is the majority contributor to the overall permittivity and its response to the frequency of the applied field is almost instantaneous. FIG. 19(c) also shows the dielectric dispersion of the blend capacitors. With increasing amounts of PPO, the permittivity gradually drops but is relatively high for low voltage electronic applications; an 8 wt % blend film has a $\varepsilon_r$~9.3. FIG. 19(c) also shows the dielectric losses (tan δ) calculated from the ratio of the imaginary and real part of the dielectric constant indicating power dissipation from the dielectric layer. An ideal dielectric would be one with high permittivity and low losses for electronic applications. The blend films with 8 wt % PPO show lower dielectric losses (0.17 at 1 MHz) compared with the baseline pure P(VDF-TrFE) films (0.21 at 1 MHz) resulting from the good insulating and low power dissipation properties of the PPO phase. Thus with small amounts of PPO, it is possible to maintain relatively high permittivity in the blend films and at the same time lower the dielectric losses.

FIG. 19(d) shows the temperature dependence of the dielectric permittivity of the blend films. The dielectric permittivity of the ferroelectric capacitors increases with temperature, reaches a maximum, then decreases. This behavior is typical of ferroelectric materials which when subjected to heating-cooling cycle undergo a ferroelectric-to-paraelectric phase transition at the Curie temperature ($T_c$). The curie temperature for our pure P(VDF-TrFE) films is approx. ~115° C., consistent with reports in literature (Bhansali et al., *Org. Electron.* 2012, 13, 1541; Ducharme et al., *Nature.* 1998, 391, 874). Notably, blend films with increasing amount of PPO did not show any change in curie temperature.

4. Thermal Stability of Blend Films

Figure 19:
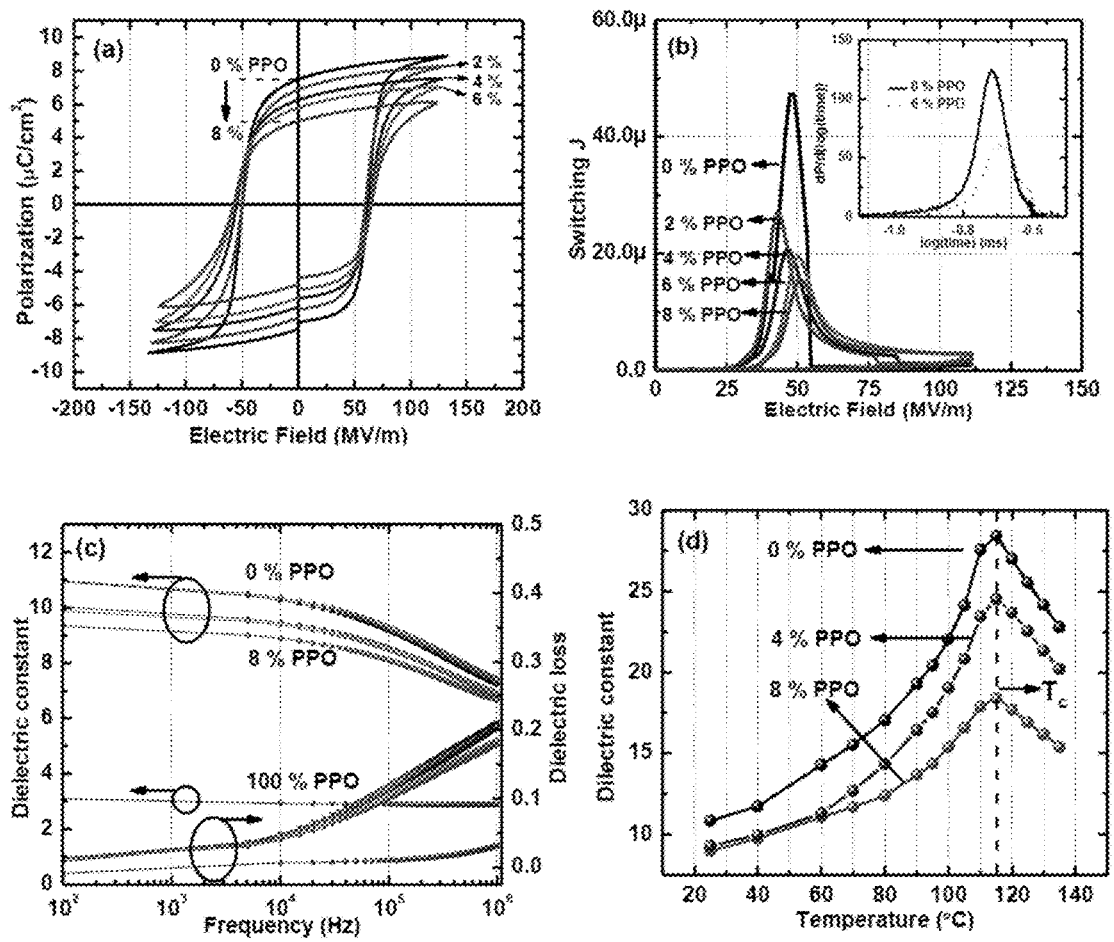
FIGS. 19(*a*)-(*d*): (a) Polarization-Electric Field hysteresis loop measurements for blend films at 10 Hz as a function of amount of PPO. (b) Switching current response from blend films with 0 to 8 wt % PPO and with Platinum/Gold electrodes. The inset shows switching characteristics for blend film at 125 MV/m, with peak of dP/d(log(t)) vs. log(t) representing respective switching times. (c) Dielectric spectroscopy study with dielectric constant (left axis) and dielectric losses (right axis) for blend films with 0 to 8 wt % PPO and pure PPO films. (d) Temperature dependence of dielectric permittivity for devices with 0, 4 and 8 wt % PPO at 1 KHz.
Figure 20:
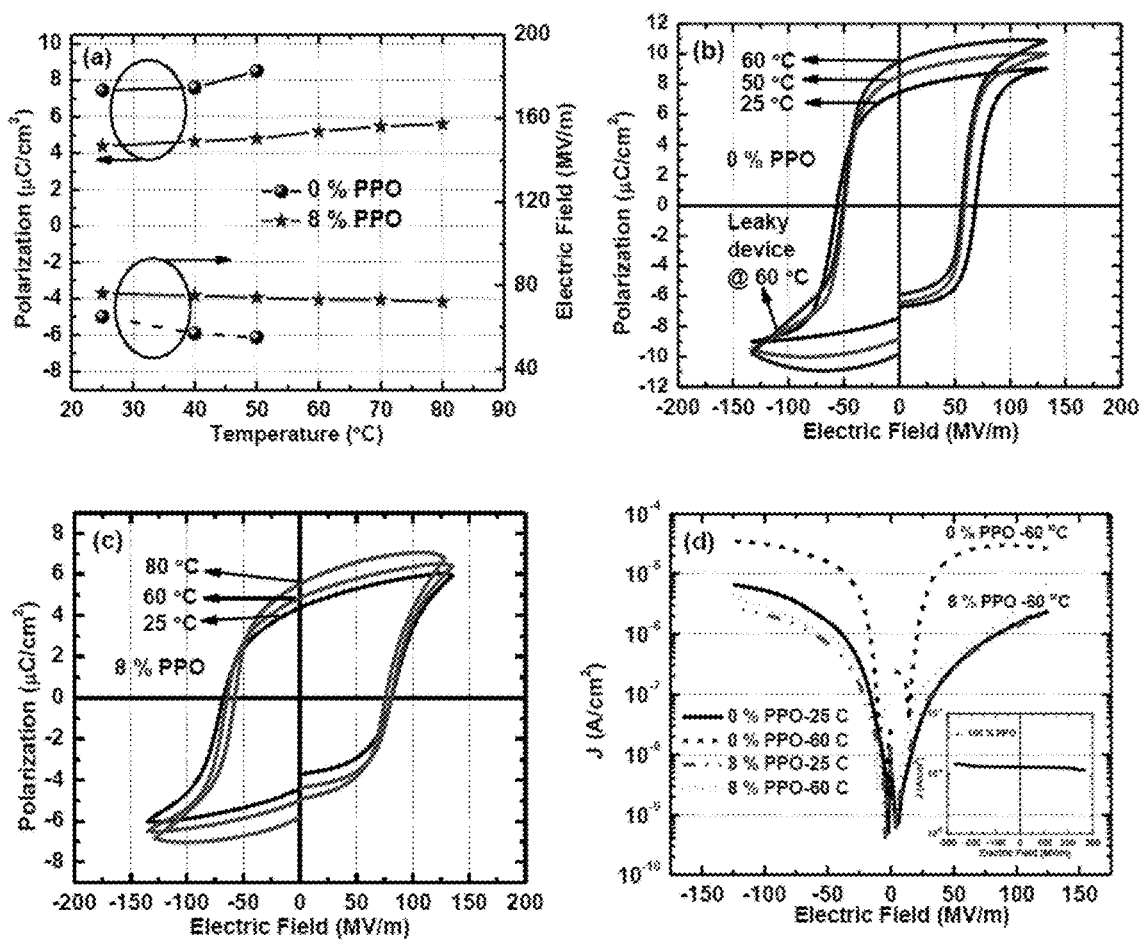
FIGS. 20(*a*)-(*d*): (a) Remnant Polarization and Coercive field as a function of temperature for pure P(VDF-TrFE) films and blend films with 8 wt % PPO. (b) Polarization-Electric Field hysteresis loop measurements for pure P(VDF-TrFE) films at 10 Hz as a function of temperature. (c) Polarization-Electric Field hysteresis loop measurements for blend films with 8 wt % PPO at 10 Hz as a function of temperature. (d) Current density-Electric Field measurements of blend films (0, 8 wt % PPO) at 0° C. and 60° C. A voltage of approximately 15 V(125 MV/m) was applied to pole the devices before measuring the leakage current in the devices. The inset shows the leakage current density of pure PPO device with Pt—Au electrodes.

Large scale integration of ferroelectric memory based on the copolymer P(VDF-TrFE) remains a challenge due to its poor thermal stability (see Li et al., *Nat. Mater.* 2013, 1). The thermal stability of pure P(VDF-TrFE) and blend capacitors with 8 wt % PPO content were studied. The devices were evaluated based on their ability to switch polarization at an applied field of 125 MV/m and a frequency of 10 Hz. FIG. 20(a) shows the measured remnant polarization and coercive field vs. temperature. In general, a slight increase in polarization and decrease in coercive field is observed with increasing temperature, since the elevated temperatures supply some of the required energy to switch the dipoles (see Zhang et al., *J. Phys. D. Appl. Phys.* 2011, 44, 155501). Thermal stability of PVDF and PVDF based ferroelectric polymers is directly related to the Curie temperature of these polymers as these polymer undergo a ferroelectric-paraelectric transition at the Curie temperature (see Bhansali et al., *Org. Electron.* 2012, 13, 1541). Notably, a rapid deterioration in stability of the pure P(VDF-TrFE) thin film capacitors at only 50° C. was observed. This is consistent with other reports for thin film P(VDF-TrFE) capacitors that the polarization decreases notably at 50° C. and rapidly deteriorates at even higher temperatures (see Li et al., *Nat. Mater.* 2013, 1). This was surprising as it is still way below the curie temperature of ~110-120° C. for a 70/30 molar ratio copolymer (see Ducharme et al., *Nature.* 1998, 391, 874; Zhang et al., *J. Phys. D. Appl. Phys.* 2011, 44, 155501). By comparison, blend films with 8 wt % PPO, showed much better thermal stability compared to pure P(VDF-TrFE) capacitors. The devices perform well upto 80° C. which are closer to curie temperature of the copolymer. The improvement in thermal stability likely did not come from a change or increase in Curie temperature of the blend films as seen in FIG. 19(*d*). FIG. 20(*b*) show the hysteresis loops for pure P(VDF-TrFE) capacitors at different temperatures. It was observed that at temperatures of 60° C. or above, the hysteresis loops displayed a resistive leaky behavior making it impossible to accurately determine polarization in these films. At higher temperatures it was noticed very leaky curves especially in the negative bias regime, indicative of surface breakdown at one of the electrode/ferroelectric interfaces. By comparison, the blend films with PPO show better saturated curves at high temperatures as can be seen in FIG. 20(*c*).

To further understand this the leakage current of pure P(VDF-TrFE) films and blend films as a function of temperature was studied. Leakage of ferroelectric capacitors based on the copolymer has been well studied and shows a relatively high leakage for thin films around 100 nm (see Khan et al., *Org. Electron.* 2011, 12, 2225; Fujisaki et al., *Appl. Phys. Lett.* 2007, 90, 162902). The introduction of TrFE is effective in obtaining the ferroelectric β phase in the copolymer but also leads to larger leakage current. If an electric field was applied to switch polarization, current leakage occurs easily at the TrFE monomer because two fluorine atoms opposite from the carbon atoms of the TrFE monomer cause a current leak path (see Fujisaki et al., *Appl. Phys. Lett.* 2007, 90, 162902). This is evident for thin films P(VDF-TrFE) capacitors with high TrFE content and several studies have reported large leakage issues. FIG. 20(*d*) shows that at saturation fields of ~125 MV/m pure P(VDF-TrFE) capacitors exhibit leakage current density in excess of $10^{-6}$ A/cm$^2$ at room temperature. On the other hand pure PPO films display low leakage current of ~$10^{-8}$ A/cm$^2$ even at high fields ~300 MV/m further highlighting the insulating properties of PPO. The blend devices with 8 wt % PPO show similar leakage currents with slightly lower currents on the negative bias. It is believed this is due to current conduction through the more leaky majority ferroelectric phase. Notably, a drastic improvement in leakage current of the blend films compared to pristine P(VDF-TrFE) films at higher temperatures of 60° C. was observed. This leakage current density of the blend films does not change much with temperature and is an order of magnitude lower than P(VDF-TrFE) films at 60° C. It is believed that the highly insulating amorphous nanospheres of PPO in the blend films act as good charge trap regions and do not allow charge carriers to move freely through the film. This directly affects thermal stability of these blend films leading us to reliably switch the polarization even at elevated temperatures.

5. Fatigue Endurance and Breakdown Strength of Blend Films

Figure 21:
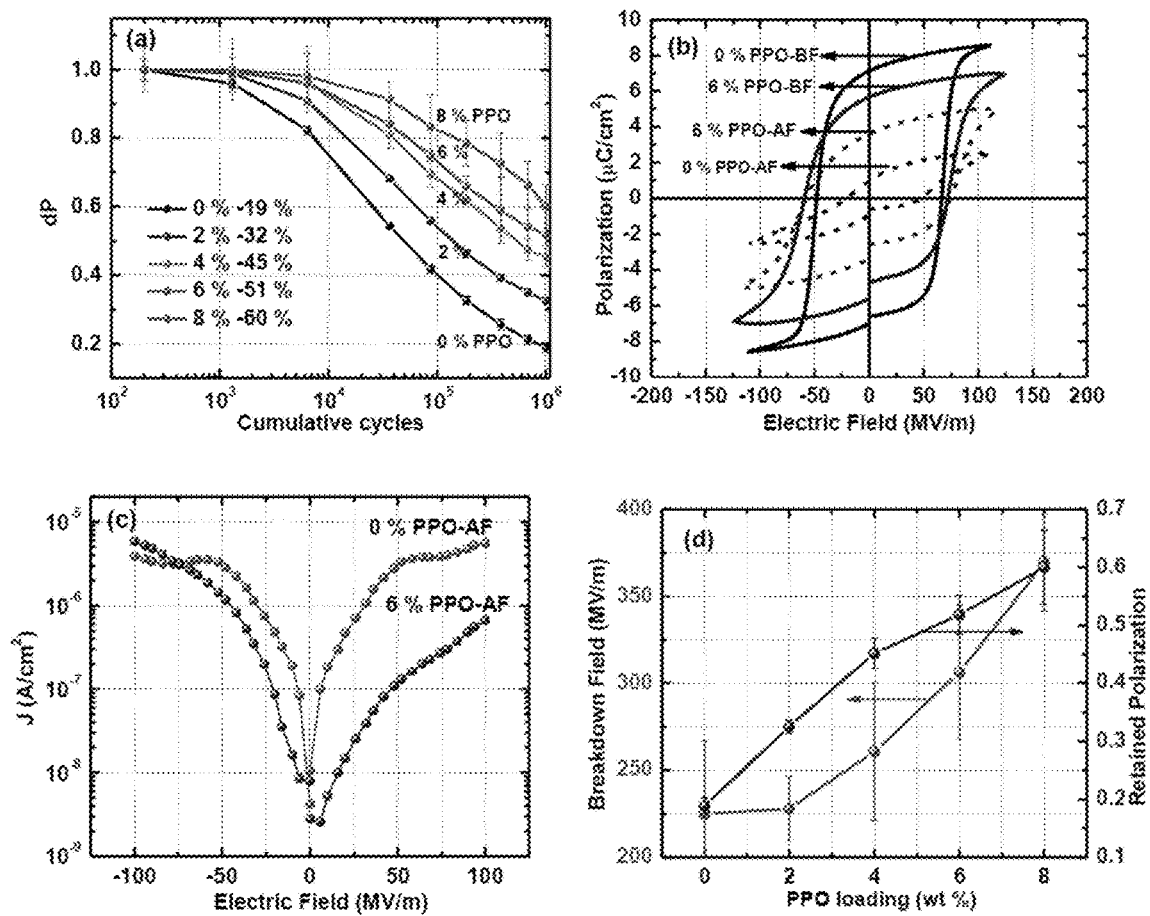
FIGS. 21(*a*)-(*d*): (a) Electrical fatigue properties showing relative polarization of blend films with 0 to 8 wt % PPO. The films were stressed at 100 MV/m and a frequency of 100 Hz and the PUND measurements were done at saturation fields of 125 MV/m and 100 Hz. (b) Polarization-Electric Field hysteresis loop measurements for pure P(VDF-TrFE) films and 6 wt % PPO films before (BF) and after fatigue (AF), characterized also at 100 Hz. (c) Current density-Electric Field measurements of pure P(VDF-TrFE) films and 6 wt % PPO films after fatigue up to 106 cycles at 100 Hz (d) Dielectric breakdown strength (Left) and Fatigue or polarization retention after 106 cycles (Right) as a function of amount of PPO in blend films.
Figure 22:
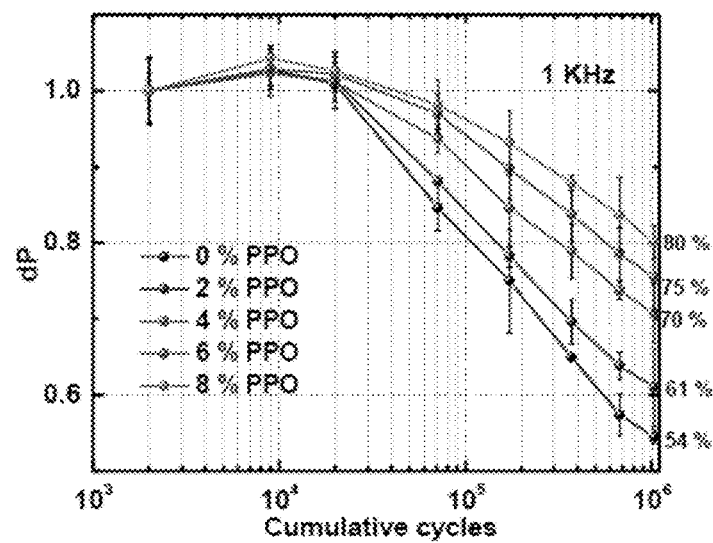
FIG. 22: Fatigue performance of blend films with 0 wt % to 8 wt % PPO content. The films were stressed at 100 MV/m and a frequency of 1 KHz and the PUND measurements were done at saturation fields of 125 MV/m and 1 KHz.

Polarization fatigue is generally described as the reduction of amount of switchable polarization with repeated switching cycles. The fatigue performance of the blend films with common Pt and Au electrodes under relevant conditions (see Zhu et al., *IEEE. T. DIELECT. EL. IN.* 2010, 17, 1172; Zhu et al., *J. Appl. Phys.* 2011, 110, 024109) was determined. FIG. 21(*a*) shows the fatigue performance of the P(VDF-TrFE)-PPO blend film capacitors up to a million ($10^6$) cycles. A bipolar triangular waveform with an electric field of 100 MV/m and 10 ms pulse width (100 Hz) was applied to fatigue the devices. The polarization was characterized periodically with a Positive-Up-Negative-Down (PUND) measurement at 125 MV/m at the same frequency. A gradual improvement in the fatigue performance of the blend devices with increasing PPO content was observed. With approx. 8 wt % PPO, the devices retain ~60% of the polarization after $10^6$ cycles, which is a significant and surprising improvement from pure P(VDF-TrFE) capacitors which only retain ~20% of the polarization. FIG. 21(*b*) shows the hysteresis curves at 100 Hz measured before and after fatigue cycles. Polarization decreases sharply from ~7 µC/cm$^2$ to only 1 µC/cm$^2$ for pure P(VDF-TrFE), while for 6 wt % PPO films the polarizations drops marginally from ~5.6 µC/cm$^2$ to ~3.6 µC/cm$^2$. The devices were also fatigued at a higher frequency of 1 kHz which is close to the maximum frequency at which a switch in the polarization of copolymer films can occur. Even at higher frequencies the films with 8 wt % PPO show excellent polarization retention of ~80% after $10^6$ cycles compared to 54% for pure P(VDF-TrFE) films (FIG. 22).

Figure 17:
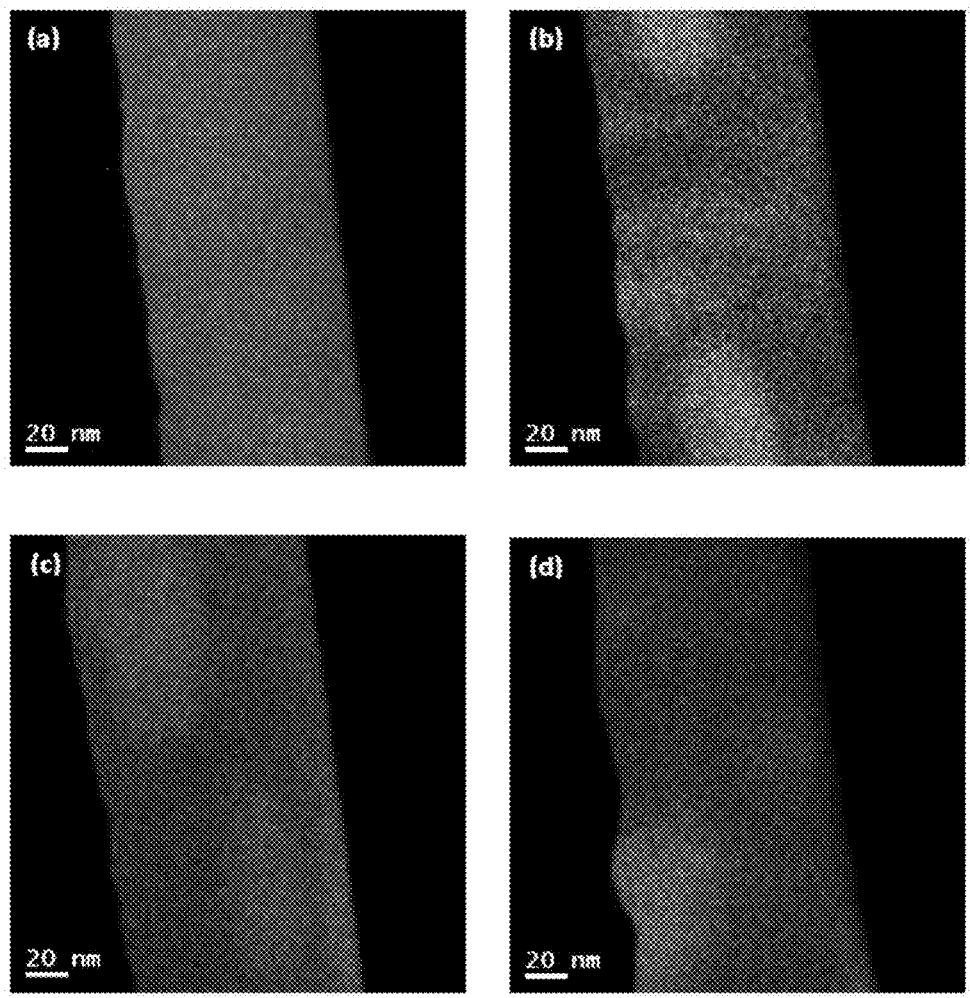
FIGS. 17(*a*)-(*d*): Cross section Energy Filtered TEM (EFTEM) images of pure P(VDF-TrFE) films (a) and blend films with 6 wt % PPO (b,c,d).
Figure 23:
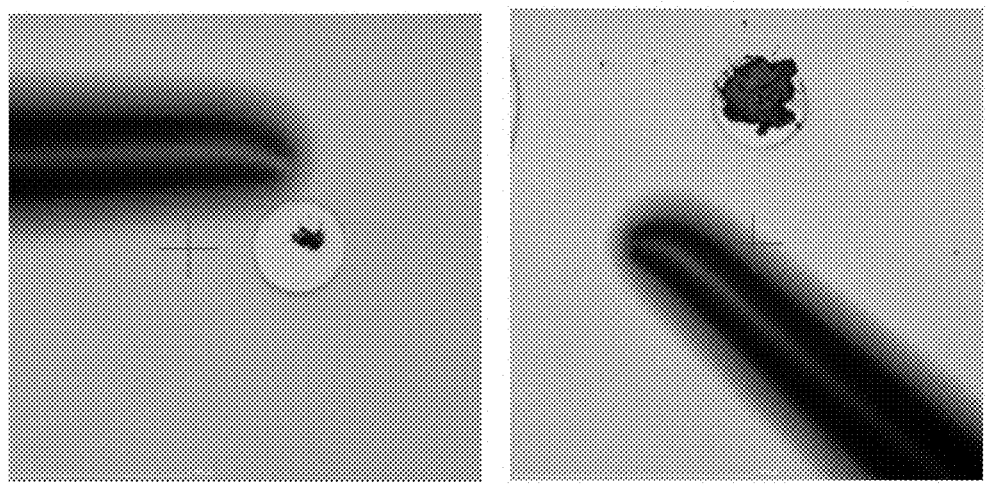
FIG. 23: Thermal breakdown and delamination of top Au electrode during fatigue of pure P(VDF-TrFE) capacitors. The devices were fatigued at 100 Hz and 12 V (100 MV/m).

To further understand the fatigue mechanism the current-voltage (leakage) characteristics of the pure and blend film devices after fatigue were compared. FIG. 17(*c*) shows high leakage current through fatigued P(VDF-TrFE) film while the films with 6 wt % PPO content show much lower leakage after fatigue (FIG. 16(*d*)). This suggests that the high number of trapped charges in pure P(VDF-TrFE) films causes poor fatigue performance. The leakage current of the P(VDF-TrFE) thin films also shows an S shaped behavior at high fields, exhibiting small negative differential resistance. This indicates current instability in the film; a situation in which a homogeneous current distribution becomes unstable and decays into filaments (see Zeller, *IEEE. T. ELECTR. INSUL.* 1987, 22, 115). The local charge and current densities are larger; leading to electrical thinning of the film. This is the reason for the lower coercive fields seen for the blend films after fatigue (FIG. 17(*b*)). This can also lead to a vastly increased thermal stress leading to electrode delamination also reported in literature especially with the use of unreactive metals such as Au (Zhang et al., *Phys. D. Appl. Phys.* 2011, 44, 155501). This was also observed during the fatigue testing of the pure P(VDF-TrFE) capacitors, where in some devices the top Au electrode delaminates due to the high thermal stress (FIG. 23). Thus continuous fatigue of thin film P(VDF-TrFE) ferroelectric capacitors leads to dielectric aging and a film close to breakdown. By comparison, blend films with PPO show only a slight increase in leakage current after fatigue, due to the good insulating and charge trapping properties of the PPO nanospheres which results in better fatigue endurance. These highly insulating nanospheres in the blend films act as good charge trap regions and do not allow charges to get trapped in the ferroelectric film, thereby improving fatigue performance. In a follow up study, the dielectric breakdown strength of the blend films was measured by using short time tests where the sweeping DC voltage was applied at a ramp rate of 3 V/s to reach device failure between 10-20 seconds was performed. FIG. 21(d) shows that with increasing PPO content, the breakdown strength of these films improves from ~225 MV/m to ~360 MV/m for 0% PPO to 8 wt % PPO content, respectively. The PPO in the blend films with its good insulating properties as well as its inherently high dielectric breakdown strength helps improve the breakdown strength of these P(VDF-TrFE)-PPO blend ferroelectric memory devices.

6. Conclusion

Ferroelectric memory from polymer blends of phase-separated ferroelectric P(VDF-TrFE) and highly insulating amorphous Polyphenylene oxide (PPO) were fabricated. The morphology of these blend films includes phase separated nanospheres of amorphous PPO, surrounded by a crystalline ferroelectric P(VDF-TrFE) matrix. The highly insulating amorphous nanospheres of PPO in the blend films acts as good charge trap regions and do not allow charge carriers to move freely through the film. This directly affects the ferroelectric and dielectric performance of the devices. The blend devices display highly improved ferroelectric and dielectric performance with low dielectric losses (<0.2 up to 1 MHz), enhanced thermal stability (~up to 353 K), excellent fatigue endurance (80% retention after $10^6$ cycles at 1 KHz) and high dielectric breakdown fields (~360 MV/m). The blend devices provide a solution to some of the important limitations of ferroelectric memory based on the copolymer, making ferroelectric memory devices based on these blends more suitable for flexible and transparent electronic applications.

The invention claimed is:

1. A ferroelectric material consisting of a polymer blend of at least two polymers, wherein the first polymer is a ferroelectric polymer and the second polymer has a low dielectric constant, wherein the second polymer is a polyphenylene ether having the following structure:

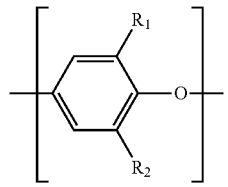

wherein the oxygen ether atom of one unit is connected to the benzene nucleus of the next adjoining unit, $R_1$ and $R_2$ are each individually a hydrogen, a halogen, a hydrocarbon radical, a halohydrocarbon radical having at least two carbon atoms between the halogen atoms and the phenyl nucleus, a hydrocarbonoxy radical, a halohydrocarbonoxy radical having at least two carbon atoms between the halogen atom and the phenyl nucleus, or a substituted or unsubstituted phenyl group, and wherein the polymer blend comprises a crystalline or semi-crystalline polymeric matrix of the ferroelectric polymer and a plurality of amorphous nanostructures comprising the second polymer, wherein the plurality of amorphous nanostructures are comprised within the polymeric matrix, and wherein the polymer blend comprises 1 to 8 wt. % of the second polymer.

2. The ferroelectric material of claim 1, wherein the polymer blend is a solution blend in which the at least two polymers have been dissolved in a common solvent.

3. The ferroelectric material of claim 2, wherein the common solvent is methyl-ethyl-ketone, cyclohexanone, hexanone, or a solvent that comprises a ratio of at least two solvents capable of dissolving both the first and second polymers.

4. The ferroelectric material of claim 1, wherein the polymer blend is a melt blend.

5. The ferroelectric material of claim 4, wherein the temperature used to obtain the melt blend is above the melting point and below the thermal degradation temperatures for each of the at least two polymers.

6. The ferroelectric material of claim 1, wherein the ferroelectric polymer is a co-polymer.

7. The ferroelectric material of claim 6, wherein the co-polymer is poly(vinylidene fluoride-trifluoroethylene) (P(VDF-TrFE)).

8. The ferroelectric material of claim 7, wherein the mole ratio of VDF to TrFE is about 80:20, 77:23, 75:25, 70:30, or 55:45.

9. The ferroelectric material of claim 1, wherein the dielectric constant of the second polymer is between about 1 to 3.

10. The ferroelectric material of claim 1, wherein the polyphenylene ether is poly(2,6-dimethyl-1,4-phenylene oxide).

11. The ferroelectric material of claim 1, wherein the ferroelectric polymer is polyvinylidene fluoride (PVDF), a poly(vinylidene fluoride-tetrafluoroethylene) co-polymer (P(VDF-TrFE)), or a poly(vinylidene-fluoride-co-hexafluoropropene) (P(VDF-HFP)).

12. The ferroelectric material of claim 1, wherein the material is a film.

13. The ferroelectric material of claim 12, wherein the thickness of the film is 20 nanometers to 10 microns.

14. The ferroelectric material of claim 12, wherein the film is a single monolayer film.

15. The ferroelectric material of claim 1, wherein the ferroelectric polymer is in crystalline or semi-crystalline form.

16. The ferroelectric material of claim 1, wherein the plurality of nanostructures are charge trap regions that are capable of storing charge.

17. The ferroelectric material of claim 1, wherein the size and number of the plurality of nanostructures are dependent on the amount by weight of the second polymer in the polymer blend.

18. The ferroelectric material of claim 1, wherein the plurality of amorphous nanostructures are nanospheres.

19. The ferroelectric material of claim 1, wherein the material is a liquid, a gel, or a melt.

20. The ferroelectric material of claim 1, wherein the material comprises from or 6 to 8% by weight of the second polymer.

21. A ferroelectric capacitor, wherein the ferroelectric capacitor comprises the ferroelectric material of claim 1, a first conductive material, and a second conductive material, wherein at least a portion of the ferroelectric material is disposed between at least a portion of the first conductive material and at least a portion of the second conductive material.

22. The ferroelectric material of claim 1 comprised in a printed circuit board.

23. The ferroelectric material of claim 1 comprised in an integrated circuit.

24. The ferroelectric material of claim 1 comprised in an electronic device.

25. The ferroelectric material of claim 1, wherein the a plurality of amorphous nanostructures has a size of less than 200 nm.

26. The ferroelectric material of claim 1, wherein the polymer blend comprises 1 to 4 wt. % of the second polymer.

27. A method of making the ferroelectric material of claim 1 comprising:
  (a) obtaining a solution comprising a solvent, the ferroelectric polymer, and the second polymer having a low dielectric constant, wherein the ferroelectric polymer and the second polymer having a low dielectric constant are dissolved in the solvent;
  (b) disposing the solution on a substrate; and
  (c) subjecting the solution to a heating or annealing step under conditions sufficient to obtain the ferroelectric material.

28. A method of making the ferroelectric material of claim 1 comprising:
  (a) obtaining the ferroelectric polymer and the second polymer having a low dielectric constant;
  (b) blending the ferroelectric polymer and the second polymer having a low dielectric constant in an extruder; and
  (c) melt extruding the ferroelectric polymer and the second polymer having a low dielectric constant under conditions sufficient to obtain the ferroelectric material.

29. A ferroelectric material consisting of a polymer blend of at least two polymers, wherein the first polymer is a ferroelectric polymer and the second polymer has a low dielectric constant, wherein the second polymer is a polyphenylene ether, and the polymer blend comprises 1 to 8 wt. % of the second polymer, and wherein the polymer blend comprises a crystalline or semi-crystalline polymeric matrix of the ferroelectric polymer and a plurality of amorphous nanostructures comprising the second polymer, wherein the plurality of amorphous nanostructures are comprised within the polymeric matrix.

30. The ferroelectric material of claim 29, wherein the ferroelectric polymer is a co-polymer.

* * * * *

UNITED STATES PATENT AND TRADEMARK OFFICE
CERTIFICATE OF CORRECTION

PATENT NO. : 10,096,352 B2
APPLICATION NO. : 14/199227
DATED : October 9, 2018
INVENTOR(S) : Mohd Adnan Khan et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 537 days.

Signed and Sealed this
Twenty-eighth Day of January, 2020

Andrei Iancu
*Director of the United States Patent and Trademark Office*